(12) United States Patent
Janani et al.

(10) Patent No.: US 9,621,200 B2
(45) Date of Patent: *Apr. 11, 2017

(54) SYSTEMS AND METHODS FOR INCREASING THE EFFECTIVENESS OF DIGITAL PRE-DISTORTION IN ELECTRONIC COMMUNICATIONS

(71) Applicant: Redline Innovations Group, Inc., Markham (CA)

(72) Inventors: Mohammad Janani, San Jose, CA (US); Jahan Ghofraniha, San Jose, CA (US); Med A. Nation, Sunnyvale, CA (US)

(73) Assignee: Redline Communications Inc., Markham (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/870,633

(22) Filed: Sep. 30, 2015

(65) Prior Publication Data

US 2016/0020791 A1    Jan. 21, 2016

Related U.S. Application Data

(63) Continuation of application No. 14/244,667, filed on Apr. 3, 2014, now Pat. No. 9,178,540.

(Continued)

(51) Int. Cl.
*H04L 25/49* (2006.01)
*H04B 1/04* (2006.01)
(Continued)

(52) U.S. Cl.
CPC ......... *H04B 1/0475* (2013.01); *H03F 1/0205* (2013.01); *H03F 1/3247* (2013.01); *H03F 3/19* (2013.01); *H03F 3/21* (2013.01); *H03F 3/211* (2013.01); *H03F 3/245* (2013.01); *H03F 3/68* (2013.01); *H03G 3/3036* (2013.01); *H03F 2200/294* (2013.01); *H03F 2200/451* (2013.01); *H03F 2201/3215* (2013.01); *H03F 2201/3233* (2013.01); *H03G 2201/103* (2013.01); *H04B 2001/0425* (2013.01)

(58) Field of Classification Search
CPC ........ H03F 1/3241; H03F 1/3247; H03F 3/24; H04L 27/368
USPC .......... 375/297, 219, 260, 296, 316; 455/91, 455/114.2
See application file for complete search history.

(56) References Cited

U.S. PATENT DOCUMENTS 6,424,681 B1    7/2002  Tellado
6,512,797 B1    1/2003  Tellado
(Continued)

*Primary Examiner* — Khai Tran
(74) *Attorney, Agent, or Firm* — Nixon Peabody LLP

(57) ABSTRACT

Various embodiments of communication systems and methods in which the communication system is operative to find, record, and use sets of pre-distortion parameters in conjunction with a pre-distortion procedure, in which each said set of pre-distortion parameters is operative to specifically counter distortions produced in a power amplifier by a specific combination of level of input signal power and level of analog gain associated with a transmission path of the communication system. In some embodiments, there is a modulator, a transmission chain, a distortion analysis mechanism, and a pre-distortion mechanism, operative to analyze and modify signals so as to counter signal distortion.

15 Claims, 21 Drawing Sheets

Related U.S. Application Data

(60) Provisional application No. 61/934,779, filed on Feb. 2, 2014.

(51) Int. Cl.
    *H03F 3/19*       (2006.01)
    *H03F 3/21*       (2006.01)
    *H03F 3/24*       (2006.01)
    *H03F 1/32*       (2006.01)
    *H03F 3/68*       (2006.01)
    *H03F 1/02*       (2006.01)
    *H03G 3/30*      (2006.01)

(56) References Cited

U.S. PATENT DOCUMENTS

| | | |
|---|---|---|
| 7,376,197 B2 | 5/2008 | Berangi |
| 8,599,962 B1 | 12/2013 | Loeb |
| 2004/0014436 A1 | 1/2004 | Lipka |
| 2005/0057303 A1 | 3/2005 | Leffel |
| 2005/0163248 A1 | 7/2005 | Berangi |
| 2005/0169411 A1 | 8/2005 | Kroeger |
| 2008/0112506 A1* | 5/2008 | Strong .................. H04L 5/1469 375/300 |
| 2008/0245047 A1 | 10/2008 | Jobin |
| 2009/0092195 A1 | 4/2009 | Guo |
| 2009/0207896 A1 | 8/2009 | Behzad |
| 2012/0082262 A1 | 4/2012 | Janani |
| 2012/0281777 A1 | 11/2012 | Ho |
| 2013/0094550 A1 | 4/2013 | Coan |

\* cited by examiner

SYSTEMS AND METHODS FOR INCREASING THE EFFECTIVENESS OF DIGITAL PRE-DISTORTION IN ELECTRONIC COMMUNICATIONS

CROSS-REFERENCE TO RELATED APPLICATIONS

This application is a continuation of and claims priority to U.S. application Ser. No. 14/244,667, filed Apr. 3, 2014, now allowed, which claims the benefit of U.S. Provisional Application No. 61/934,779, filed Feb. 2, 2014, each of which is hereby incorporated by reference herein in its entirety.

BACKGROUND

Digital Pre-Distortion ("DPD") is a basic element of communications, including both wireless and wireline communication systems. It is used to increase the effectiveness and the efficiency of power amplifiers, particularly in determining system inputs to result in acceptable output power. In traditional communications, output power is modified by altering the input power from a modulator, or by altering the gain level of a communication transmission chain, or by altering both the input power and the gain level to the degree that a change in one parameter is exactly offset by a corresponding and opposite change in the other parameter.

SUMMARY

Described herein are electronic communication systems and methods to manage and improve the DPD process resulting in maximum output power with minimal signal distortion by considering changes in both an input power level and a transmission chain gain.

One embodiment is a communication system operative to manage pre-distortion procedures. In one particular embodiment, the system includes a transmission chain comprising a power amplifier, in which the transmission chain is associated with a level of analog gain that is configurable by the communication system. Also in this particular embodiment, there is a modulator operative to feed the transmission chain with a transmission signal having a level of power that is configurable by the communication system. One level of transmission signal power may occur in a first state of operation of the system, and a different level of transmission power may occur in a second state of operation of the system. Also in this particular embodiment, the communication system is operative to find, record, and use sets of pre-distortion parameters in conjunction with a pre-distortion procedure, in which each said set of pre-distortion parameters is operative to specifically counter distortions produced in the power amplifier by a specific combination of said level of power and said level of analog gain. For example, a particular set of parameters XY may be operative to specifically counter distortions produced by the combination of X-level of input power and Y-level of transmission chain gain.

One embodiment is a method for managing pre-distortion procedures in a communication system. In one particular embodiment, a communication system determines a first set of transmission parameters associated with a transmission chain belonging to the communication system, in which the first set of transmission parameters includes at least (i) a first level of power associated with a first transmission signal feeding the transmission chain, and (ii) a first level of analog gain as applied by the transmission chain to the first transmission signal. Also in this particular embodiment, the communication system finds a first set of pre-distortion parameters associated with a pre-distortion procedure operative to counter distortions produced, in conjunction with the first set of transmission parameters, in a power amplifier belonging to the transmission chain. Also in this particular embodiment, the communication system applies the pre-distortion procedure using the first set of pre-distortion parameters, and in that way counters all or at least some of the distortion in the output signal.

BRIEF DESCRIPTION OF THE DRAWINGS

The embodiments are herein described, by way of example only, with reference to the accompanying drawings. No attempt is made to show structural details of the embodiments in more detail than is necessary for a fundamental understanding of the embodiments. In the drawings.

DETAILED DESCRIPTION

As used herein, "dual-use" is a process in which a receiver chain alternates, according to some scheme, between receiving signals with information payloads and receiving other information signals for purposes of signal monitoring or improving the quality of signals.

As used herein, a "radio-frequency switching fabric" is hardware, software, or a combination of hardware and software that is capable of switching the reception of a radio receiver chain between a signal with information payload and a different signal.

As used herein, "inverse distortion" is the process of inserting a kind of distortion into a radio signal to offset, at least in part, the known distortion characteristics of a transmitter, a power amplifier, or some other hardware through which a radio signal may pass.

As used herein, "maximal-ratio-combining", sometimes abbreviated as "MRC", is one or more techniques employed as a method for diversity combining of radio signals in which the signals of the various channels are added together to improve the quality of the resulting combined signal.

As used herein, "MIMO" is an acronym for a multiple-input-multiple-output communication configuration, which is well known in the art.

As used herein, "pre-clipping" is a method by which an initial input sequence of modulated data of a wireless transmission is processed prior to clipping procedure. Pre-clipping may be associated with a decimation mechanism, or with a zero-padding mechanism by way of example.

As used herein, "DPD" is an acronym for "digital pre-distortion", which is a description that may be applied to a structure that determines or counters distortion characteristics in an output signal, or a description that may be applied to a method by which distortion characteristics in an output signal are determined or countered.

As used herein, "memory configuration" is a lookup table that has been stored in a memory. The lookup table includes two or more records, in which each record has at least a given input power level and a given input transmission chain gain, plus the pre-distortion parameters associated with those particular input power levels and transmission chain gain.

Figure 1A:
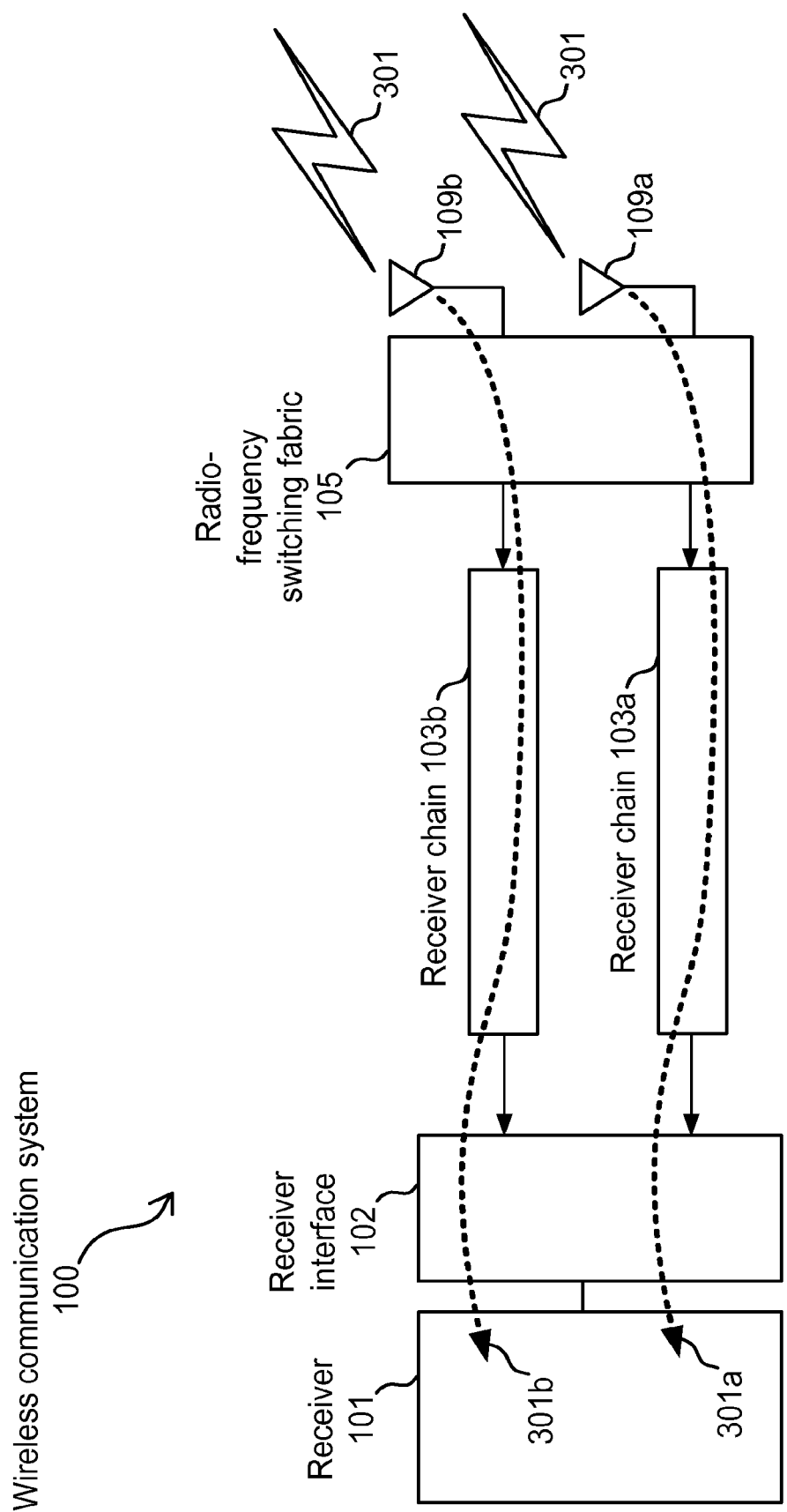
FIG. 1A illustrates one embodiment of a wireless communication system with two receiver chains processing two signals.

FIG. 1A illustrates one embodiment of a wireless communication system 100 with two receiver chains 103a and 103b processing two signals 301a and 301b respectively. FIG. 1A shows a wireless communication system 100, including a receiver 101 connected to and receiving signals from a receiver interface 102. The receive interface 102 is connected to and receives signals 301a, 301b from multiple receiver chains respectively, here marked as 103a and 103b, but there may be three or more such receiver chains. The receiver chains 103a and 103b in term are connected to and receive signals from a radio-frequency switching fabric 105, which is connected with and receives signals from multiple antennas, here 109*a* and 109*b*. It will be understood that there is a separate antenna for each receiver chain, here shown as antenna 109*a* communicatively connected to receiver chain 103*a*, and antenna 109*b* communicatively connected to receiver chain 103*b*, but there may be three or more sets of antennas and receiver chains. Each antenna receives the same transmission, here 301, and the signals 301*a*, 301*b* associated with transmission 301 are transported through the wireless communication system 100 until they are combined at receiver 101 using any kind of signal processing techniques to enhance the quality of the received signals. Transmission 301 may be an incoming wireless transmission.

Figure 1B:
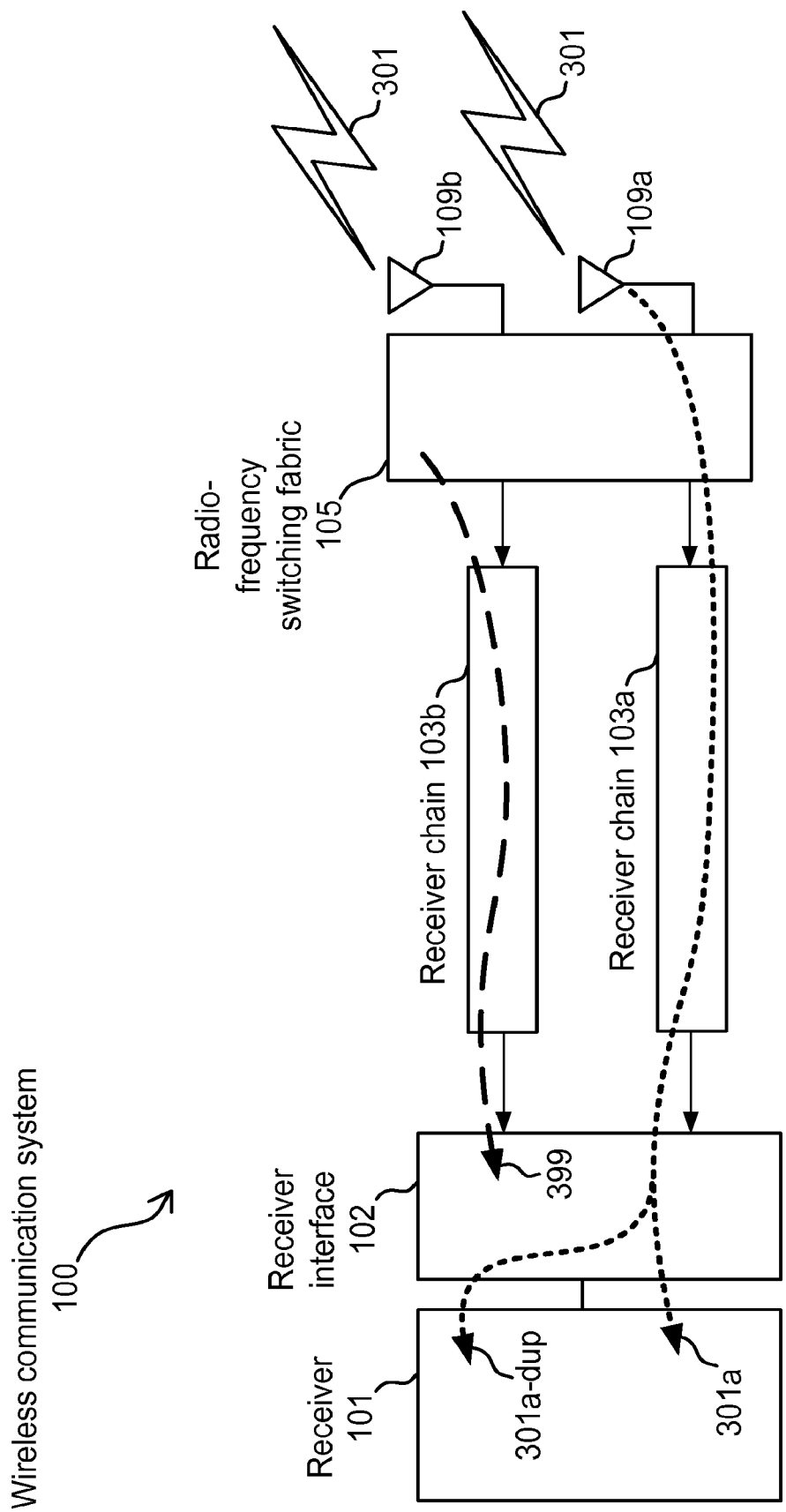
FIG. 1B illustrates one embodiment of a wireless communication system with two receiver chains processing one communication signal with an information payload and one communication signal for purposes of monitoring and testing, in which the signal with information payload has been duplicated at the receiver.

FIG. 1B illustrates one embodiment of a wireless communication system with two receiver chains processing one communication signal with an information payload and one communication signal for purposes of monitoring and testing, in which the signal with information payload has been duplicated at the receiver. The state of wireless communication system 100 depicted in FIG. 1B is different from the state of wireless system 100 depicted in FIG. 1A, in several respects. First, in FIG. 1B, the radio switching fabric 105 has switched the signal received by receiver chain 103*b*, such that the signal received by receiver chain 103*b* is not signal 301*a* received at 109*a*, nor signal 301*b* received at 109*b*, but rather a third signal 399 that is totally different from signals 301*a*, 301*b*. Second, in FIG. 1B, this third signal, 399, is conveyed by the wireless communication system 100 through receiver chain 103*b*, to receiver interface 102. Signal 399 may be analyzed on several parameters, and the results of such analysis may be used is several ways. Third, in FIG. 1B, the receiver interface 102 duplicates the signal 301*a* received at antenna 109*a* and conveyed through receiver chain 103*a*, and conveys this duplicated signal 301*a*-dup to receiver 101. At substantially all times during which the communication system is operating for reception of transmission 301, receiver 101 receives either two signals 301*a* and 301*b*, or two signals 301*a* and 301*a*-dup. As described herein, receiver chain 103*b* is operating in dual-mode, sometimes conveying communications 301*b* from antenna 109*b*, and sometimes conveying a third signal 399 from the radio-frequency switching fabric 105.

Figures 2A, 2B:
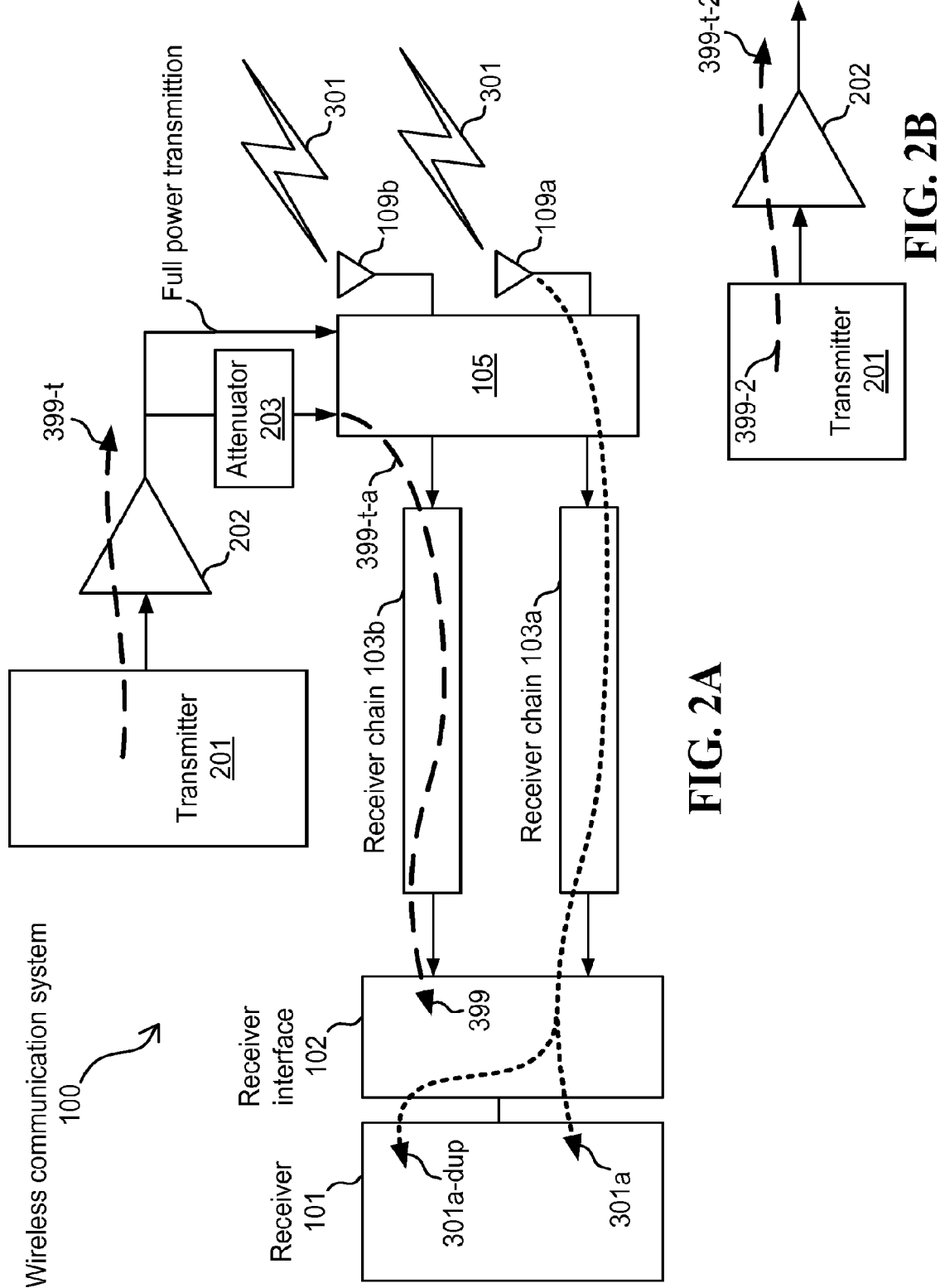
FIG. 2A illustrates one embodiment of a wireless communication system with two receiver chains processing one communication signal with an information payload and one communication signal for purposes of monitoring and testing distortions introduced by a power amplifier, in which the signal for monitoring and testing has passed through an attenuator.
FIG. 2B illustrates one embodiment of a signal being transmitted by a transmitter through a power amplifier, in which the signal has been pre-distorted by insertion of an inverse distortion in order to counter at least in part some of the distortion characteristics of the power amplifier.

FIG. 2A illustrates one embodiment of a wireless communication system with two receiver chains processing one communication signal with an information payload and one communication signal for purposes of monitoring and testing distortions introduced by a power amplifier, in which the signal for monitoring and testing has passed through an attenuator. FIG. 2A differs from FIG. 1B in several respects. First, in FIG. 2A, there is an additional transmitter 201 that is transmitting a signal. Second, in FIG. 2A the signal transmitted by transmitter 201 travels through a power amplifier 202, which amplifies the transmission signal but in so doing may introduce distortions due to imperfects in amplifier 202. Third, in FIG. 2A the signal passing through power amplifier 202 then passes through an attenuator 203 which attenuates the signal. The attenuated signal 399-*t*-*a* passes through the radio-frequency switching fabric 105 to receiver chain 103*b*, and then to receiver interface 102. The signal 399-*t*-*a*, which becomes signal 399 at receiver interface 102, may be analyzed for distortion characteristics, and actions may be taken to counter-act such distortion, as shown in FIG. 2B below.

FIG. 2B illustrates one embodiment of a signal being transmitted by a transmitter through a power amplifier, in which the signal has been pre-distorted by insertion of an inverse distortion in order to counter at least in part some of the distortion characteristics of the power amplifier. In FIG. 2B, transmitter 201 transmits a modified signal 399-2, in that the modified signal has had inserted into it inverse distortion to counteract, at least in part, the distortions of transmitter 201 or of power amplifier 202 as determined in the analysis of signal 399-*t*-*a* at receiver interface 102. Modified signal 399-2 is now transmitted by transmitter 201, amplified by power amplifier 202, and will continue through the wireless communication system 100.

Figure 3:
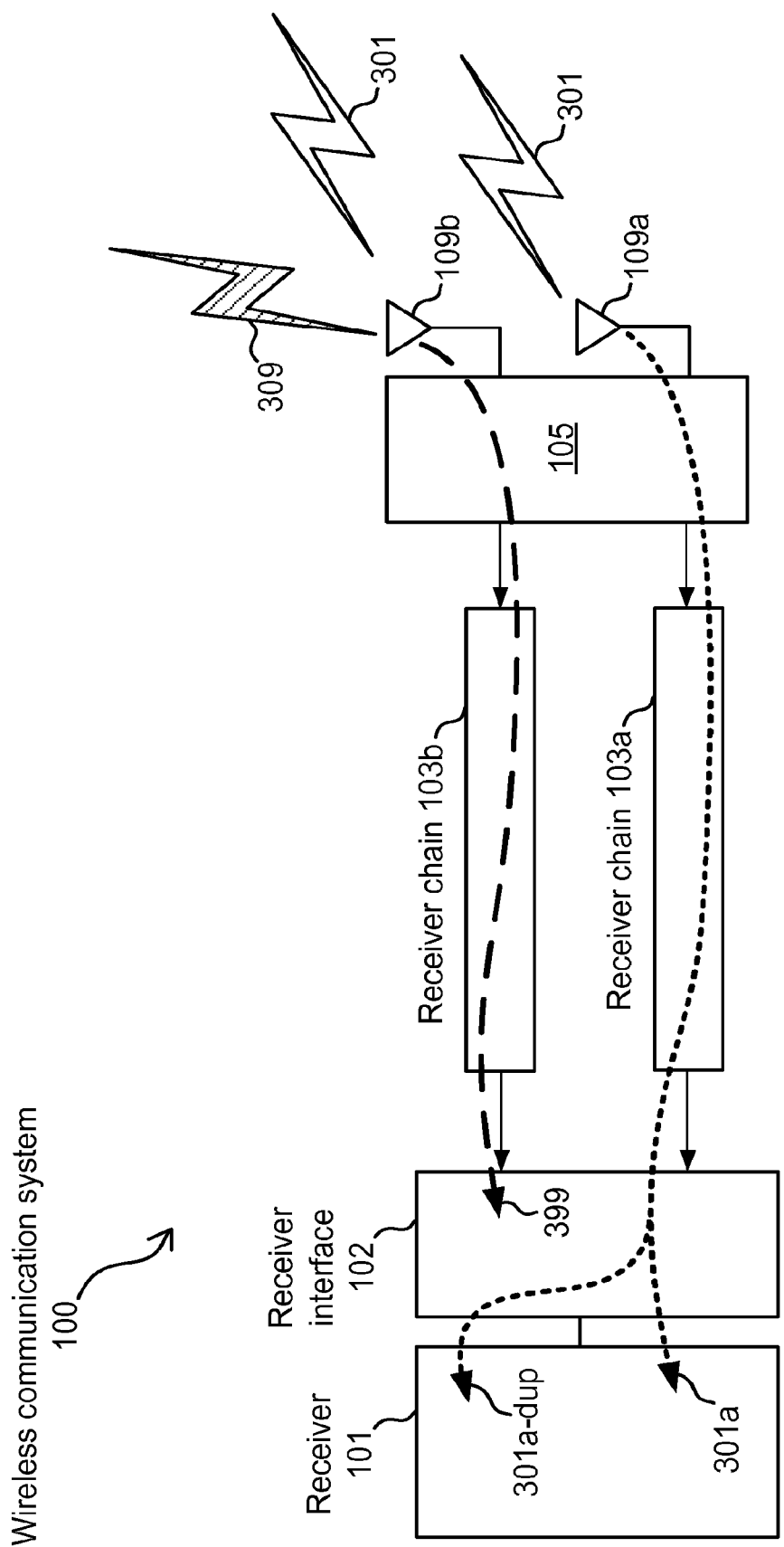
FIG. 3 illustrates one embodiment of a wireless communication system with two receiver chains processing one communication signal with an information payload and one communication signal for purposes of monitoring and testing, in which the signal with information payload has been duplicated at the receiver.

FIG. 3 illustrates one embodiment of a wireless communication system with two receiver chains processing one communication signal with an information payload and one communication signal for purposes of monitoring and testing, in which the signal with information payload has been duplicated at the receiver. FIG. 3 is different from FIG. 2A in that in FIG. 3 there is no transmitter 201 or power amplifier 202 or attenuator 203, but rather radio-switching fabric 105 has switched the signal received by antenna 109*b* from transmission 301 to transmission 309 that is different from transmission 301. It will be understood that transmission 309 may be a different frequency than the frequency for 301, or may be a different time slice from the time slice of transmission 301, or may be a different code/standard from the code/standard of transmission 301, or may be some combination of different frequencies, time slices, and codes/ standards. The transmission 309, also referred to as an incoming wireless transmission, received at antenna 109*b* is conveyed through radio-switching fabric 105 to receiver chain 103*b*, and then to radio interface 102 in the form of signal 399. There may be multiple reasons for switching a transmission from 301 to 309. For example, the wireless communication system 100 may wish to determined if a transmission band represented by transmission 309 is occupied with traffic, and if not, whether communication traffic may be placed on that band. For example, the wireless communication system 100 may wish to determine if there is possible interference with transmission 301 from transmission 309, and if so, to determine how such interference may be reduced or avoided.

Figure 4:
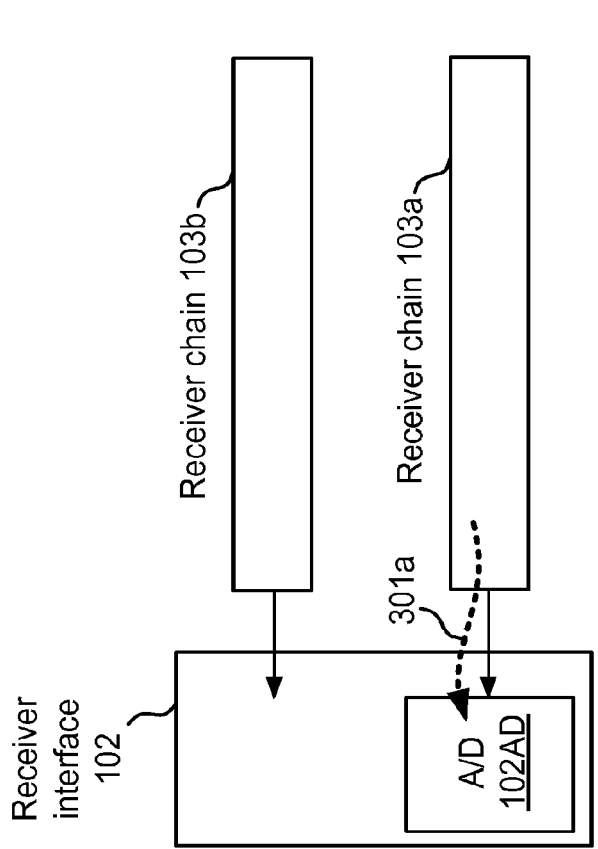
FIG. 4 illustrates one embodiment of a receiver interface that may be digital, and that includes an analog-to-digital converter operative to convert a first signal that is analog into a digital form.

FIG. 4 illustrates one embodiment of a receiver interface that may be digital, and that include an analog-to-digital converter operative to convert a first signal that is analog into a digital form. FIG. 4 shows one possible embodiment for the duplication of signal 301*a*. In FIG. 4, first receiver chain 103*a* receives signal 301*a*, and sends it to receiver interface 102. Receiver interface 102 includes an analog-to-digital converter 102AD, which converts signal 301*a* from analog into digital. When signal 301*a* is then duplicated and sent to receiver 101 as 301*a*-dup, it is duplicated and sent as a digital rather than an analog signal. In other embodiments, signal 301*a* would remain in analog form, but this would require receiver interface 102 to duplicate analog signal 301*a* and then send it, in analog form.

Figure 5:
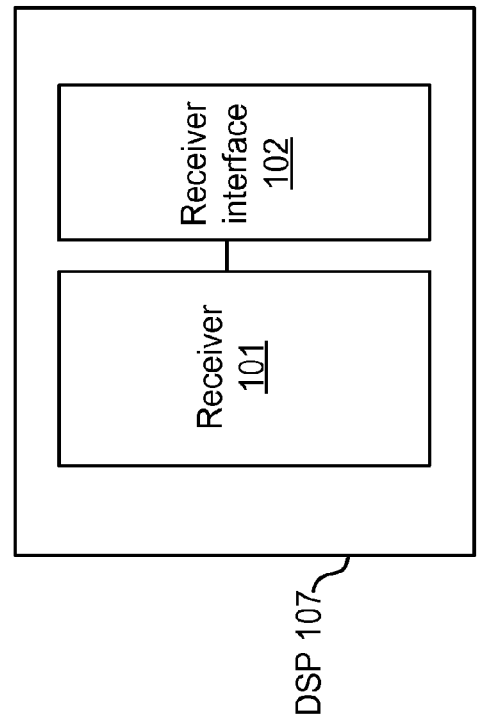
FIG. 5 illustrates one embodiment of a receiver and a receiver interface that have been implemented in a digital-signal-processor.

FIG. 5 illustrates one embodiment of a receiver and a receiver interface that has been implemented in a digital-signal-processor. FIG. 5 shows receiver interface 102 and receiver 101, that have been implemented in a DSP 107, which is one way by which the receiver interface 102 and receiver 101 may be implemented and structured.

One embodiment is a wireless communication system 100 operative to seamlessly dual-use a receiver chain 103*b* for receiving incoming transmissions and for other signal sensing purposes. In one specific embodiment, the system 100 includes receiver 101, a first receiver chain 103*a* associated with a first antenna 109*a*, and a second receiver chain 103*b* associated with a second antenna 109*b*. Also in this specific embodiment, the receiver 101 is operative to process a first signal 301a received via the first receiver chain 103a and the first antenna 109a, together with a second signal 301b received via the second receiver chain 103b and the second antenna 109b, thereby enhance reception of at least one incoming wireless transmission 301 associated with the first 301a and second signals 301b. Also in this specific embodiment, the wireless communication system 100 is operative to utilize the second receiver chain 103b, during at least one period of the incoming wireless transmission 301, for reception of a third signal 399 not associated with the incoming wireless transmission 301, thereby making dual-use of the second receiver chain 103b, and consequently making the second signal 301b unavailable in the receiver 101 for enhancement during the at least one period. Also in this specific embodiment, the wireless communication system 100 is further operative, during the at least one period, to substitute the second signal 301b with a duplication 301a-dup of the first signal 301a, in compensation for the unavailability of the second signal 301b in the receiver 101, and without any knowledge of said receiver 101 regarding such utilization requiring said substitution.

In an alternative embodiment to the system just described, the wireless communication system 100 further includes a receiver interface 102 operative to perform the duplication of signal 301a and compensation for the loss of signal 301b.

In one variation of the alternative embodiment just described, further the receiver interface 102 is digital and includes an analog-to-digital converter 102AD operative to convert the first signal 301a into a digital form. In this variation, the receiver 101 is also digital, thereby enabling duplication of signal 301a and compensation for loss of signal 301b to be made at the digital level.

In one configuration of the variation just described, further the receiver 101 and the receiver interface 102 are implemented in a digital-signal-processor 107.

In a second variation of the alternative embodiment described above, the wireless communication system 100 also includes a power amplifier 202 having certain signal distortion characteristics, a radio-frequency attenuator 203, and a radio-frequency switching fabric 105. Also in this second variation, the wireless communication system 100 is further operative to transmit a first transmission 399-t via the first power amplifier 202, resulting in the first transmission 399-t having a distortion associated with the signal distortion characteristics. Also in this second variation, the wireless communication system 100 is further operative to use the radio-frequency switching fabric 105 and the radio-frequency attenuator 203 to bypass the second antenna 109b, and to inject, during the at least one period of said incoming wireless transmission 301, an attenuated version 399-t-a of said first transmission 399-t having the distortion, into the second receiver chain 103b, wherein said attenuated version 399-t-a becomes the third signal 399. Also in this second variation, the wireless communication system 100 is operative to determine the first signal distortion characteristics of the power amplifier 202, via analysis of the distortion present in the third signal 399 received via said second receiver chain 103b.

Figure 6:
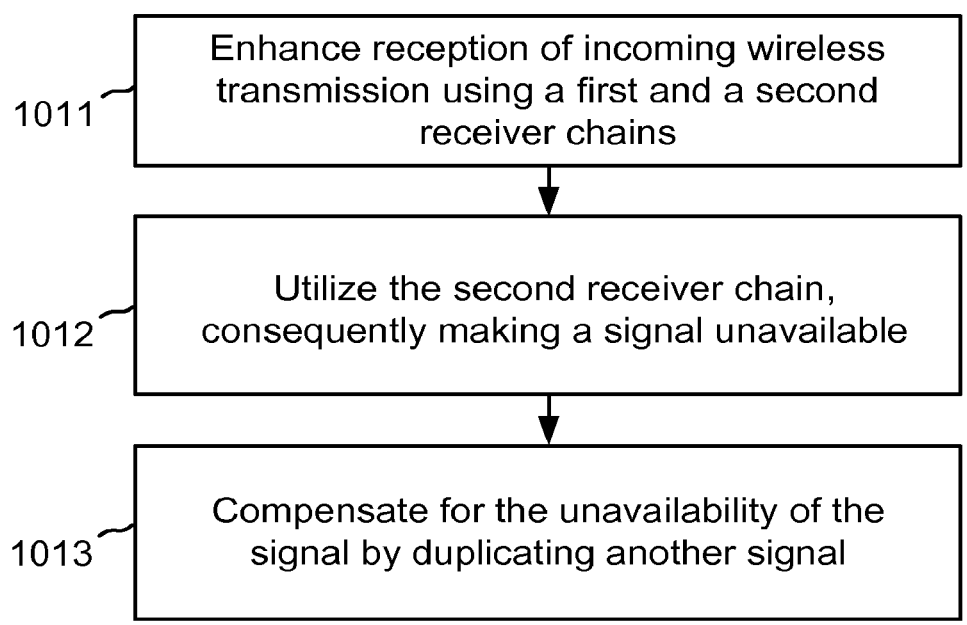
FIG. 6 illustrates one embodiment of a method by which a wireless communication system may seamlessly dual-use a receiver chain for receiving incoming transmissions and for other signal sensing purposes.

FIG. 6 illustrates one embodiment of a method by which a wireless communication system may seamlessly dual-use a receiver chain for receiving incoming transmissions and for other signal sensing purposes. In step 1011, a wireless communication system 100 enhances, in a receiver 101, reception of at least one incoming wireless transmission 301, by processing (i) a first signal 301a associated with the incoming wireless transmission received via a first receiver chain 103a and a first antenna 109a, and (ii) a second signal 301b associated with the incoming wireless transmission received via a second receiver chain 103b and a second antenna 109b. In step 1012, the wireless communication system 100 utilizes the second receiver chain 103b, during at least one period of the reception, for receiving a third signal 399 not associated with the incoming wireless transmission 301, thereby dual-using the second receiver chain 103b, and consequently making the second signal 301b unavailable in the receiver 101 for enhancing during the at least one period. In step 1013, the wireless communication system 100 compensates, during the at least one period, for the unavailability of the second signal 301b in the receiver 101, by substituting to the receiver 101 the second signal 301b with a duplication 301a-dup of the first signal 301a, thereby making the receiver 101 unaware of the utilization requiring said substitution.

In a first alternative embodiment to the method just described, the wireless communication system 100 transmits 201, a first transmission 399-t via a power amplifier 202 having certain signal distortion characteristics, resulting in the first transmission 399-t having a distortion associated with the first signal distortion characteristics. Also in this alternative embodiment, the wireless communication system 100 injects, during the at least one period of the reception, an attenuated version 399-t-a of the first transmission 399-t having the distortion, into the second receiver chain 103b, wherein the attenuated version 399-t-a becomes the third signal 399, thereby bypassing the second antenna 109b and facilitating said utilization requiring said substitution. Also in this first alternative embodiment, the wireless communication system 100 determines the signal distortion characteristics of the power amplifier 202, by analyzing the distortion present in the third signal 399 received via said second receiver chain 103b.

In a first variation of the first alternative embodiment just described, further the enhancement is adversely affected as a result of the duplication during the at least one period. In order to reduce or even minimize these adverse impacts, the wireless communication system 100 reduces the length of the at least one period to a necessary minimum. In one configuration of the first variation just described, the necessary minimum duration of the at least one period is at least 100 microseconds, but not longer than 10 milliseconds, thereby allowing sufficient time for the wireless communication system 100 to analyze the distortion present in the third signal received via the second receiver chain 103b during the at least one period.

In a second variation of the first alternative embodiment described above, the wireless communication system 100 further operates in a frequency-division-duplex mode, such that at least most of the transmitting of the first transmission 399-t occurs substantially simultaneously with the reception of at least one incoming wireless transmission 301, and such that the transmitting is done at a first frequency, and the reception is done at a second frequency.

In one configuration of the second variation just described, further the wireless communication system 100 configures the second receiver chain 103b to operate in the second frequency during the enhancement. Also in such configuration, the wireless communication system 100 configures the second receiver chain 103b to operate in the first frequency during the utilization of the second receiver chain 103b.

In a second alternative embodiment to the method described above, further the incoming wireless transmission 301 belongs to a first frequency band. Also in this second alternative embodiment, the wireless communication system 100 receives, during the at least one period of the reception, via the second receiver chain 103b, the third signal 399 associated with a second wireless transmission 309 (FIG. 3) belonging to a second frequency band, thereby facilitating monitoring of said second frequency band.

In one variation of the second alternative embodiment just described, further the enhancement is adversely affected during the at least one period, as a result of the duplication of signal 301a. Therefore, to reduce the adverse effect on the enhancement, the wireless communication system 100 keeps the at least one period to a necessary minimum.

In one configuration of the variation just described, further the necessary minimum is at least one millisecond, but not longer than 10 milliseconds, thereby allowing sufficient time for the monitoring of the second frequency band during the at least one period.

In a third alternative embodiment to the method described above, further the enhancement is associated with maximal-ratio-combining. Also in this third alternative embodiment, the receiver 101 combines the first 301a and second signals 301b using maximal-ratio-combining techniques, thereby enhancing a signal-to-noise ratio associated with the incoming wireless transmission 301.

In a fourth alternative embodiment to the method described above, further the enhancement is associated with spatial-multiplexing. Also in this fourth alternative embodiment, receiver 101, using spatial-multiplexing reception techniques, decodes at least two transmission streams from the first 301a and second signals 301b, thereby enhancing reception rates associated with the incoming wireless transmission 301.

In one variation of the fourth alternative embodiment described above, further the first 103a and second receiver chains 103b are parts of a multiple-input-multiple-output communication configuration.

In a fifth alternative embodiment to the method described above, further the at least one period associated with the utilization is essentially periodic and is kept short relative to periods associated with the enhancement.

In one variation of the fifth alternative embodiment described above, the at least one period associated with the utilization is shorter than the periods associated with the enhancement by a factor of between 100,000 and 10,000,000.

Figure 7:
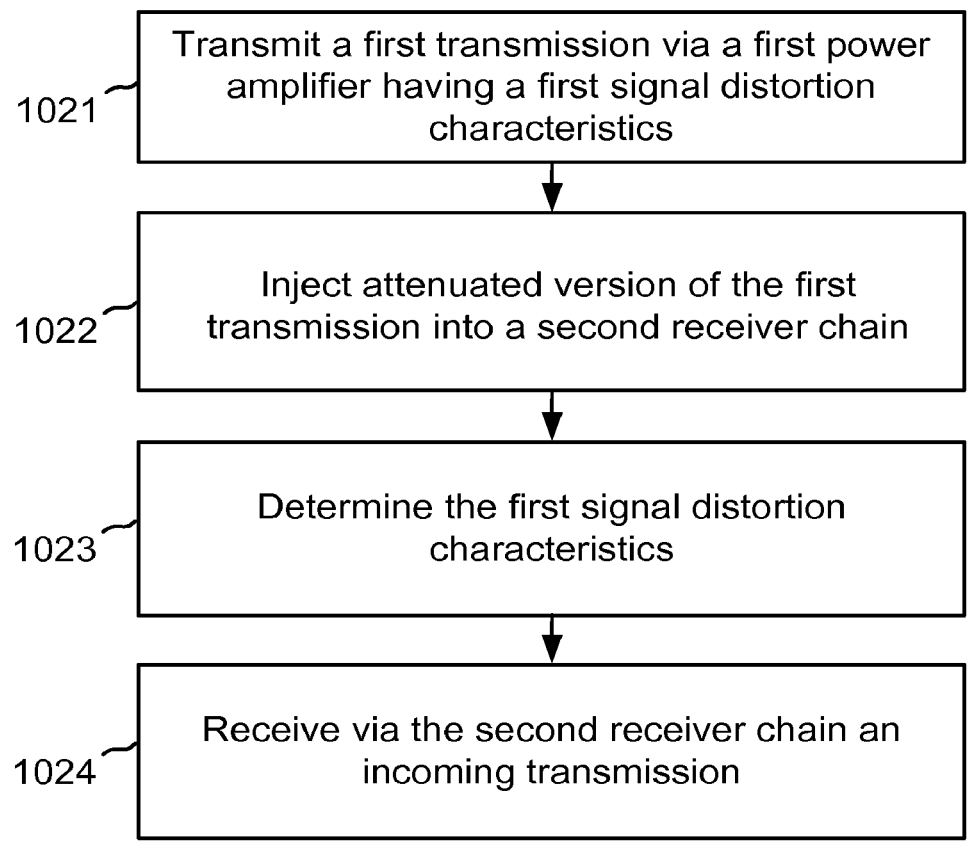
FIG. 7 illustrates one embodiment of method by which a wireless communication system may dual-use a receiver chain for determining distortion characteristics of a power amplifier and for receiving incoming transmissions with information payload.

FIG. 7 illustrates one embodiment of a method by which a wireless communication system may dual-use a receiver chain for determining distortion characteristics of a power amplifier and for receiving incoming transmissions with information payload. In step 1021, a wireless communication system 100 transmits a first transmission 399-t via a first power amplifier 202 having certain signal distortion characteristics. The result is that the first transmission has the distortion associated with the distortion characteristics of the power amplifier 202. In step 1022, the wireless communication system 200 injects an attenuated version 399-t-a, of the first transmission 399-t having the distortion, into a second receiver chain 103b belonging to the communication system 101. In step 1023, the wireless communication system 100 determines certain signal distortion characteristics of the power amplifier 202, by analyzing the distortion of the attenuated version 399-t-a of the first transmission 399-t received via the second receiver chain 103b as signal 399. In step 1024, the wireless communication system receives, via the second receiver chain 103b, an incoming transmission 301 for decoding by said communication system 100, thereby dual-using the second receiver chain 103b for both (i) determining the first signal distortion characteristics, and (ii) receiving the incoming transmission 301.

In a first alternative embodiment to the method just described, further the wireless communication system 100 pre-distorts 399-2 a second transmission intended for transmission via the power amplifier 202, using the determination of the first signal distortion characteristics. Also in this embodiment, the wireless communication system 100 transmits the second transmission 399-t-2 pre-distorted, via the power amplifier 202, thereby at least partially countering the signal distortion characteristics of the power amplifier 202.

In a second alternative embodiment to the method described above, further the first transmission 399-t is a radio-frequency transmission, and the second receiver chain 103b is a radio-frequency receiver chain.

In one variation of the second alternative embodiment just described, further the wireless communication system 100 couples the power amplifier 202 with the second receiver 103b chain prior to the injection, using a first radio-frequency coupling mechanism comprising the attenuator 203 and the radio-frequency switching fabric 105, thereby facilitating the injection.

In one configuration of the variation just described, further the wireless communication system 100 releases the coupling prior to the reception of the incoming transmission 301, thereby facilitating the reception of said incoming transmission 301

This description presents numerous alternative embodiments. Further, various embodiments may generate or entail various usages or advantages. For example, using the radio-frequency switching fabric 105 to switch signals in receiver chain 103b allows dual-use of receiver chain 103b, which may reduce the overall amount of hardware required by the wireless communication system 100.

Figure 8A:
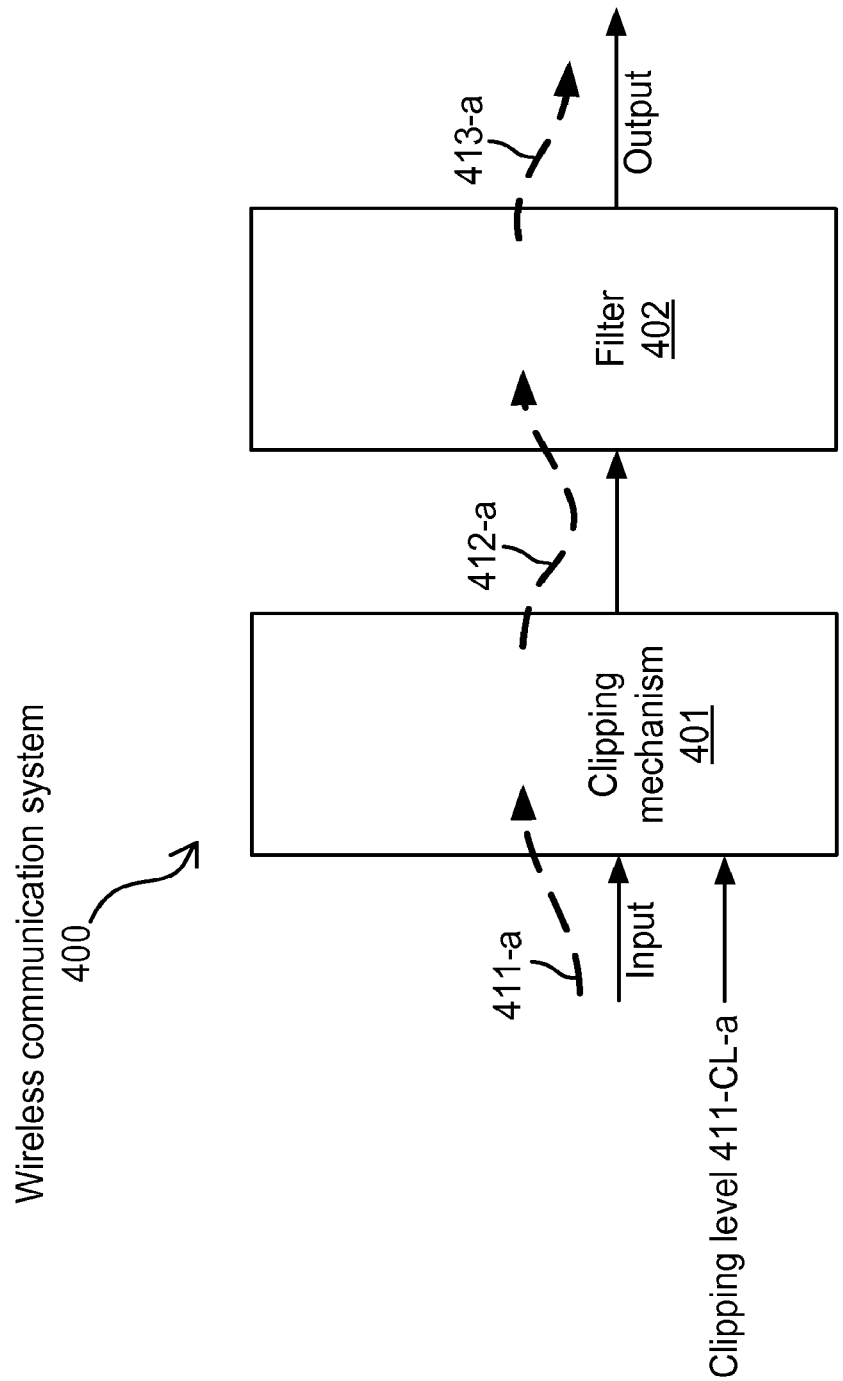
FIG. 8A illustrates one embodiment of a wireless communication system a clipping mechanism and a filter for a first iteration of clipping a signal.

FIG. 8A illustrates one embodiment of a wireless communication system 400 a clipping mechanism and a filter for a first iteration of clipping a signal. A sequence of modulated data 411-a is inputted as a signal into a clipping mechanism 401. The clipping mechanism 401 has been set at first clipping level 411-CL-a, and clips the signal according to this first level. The clipped signal of modulated data is outputted as 412-a, and is then passed through a filter 402, which executed out-of-band signal filtering, and outputs the signal 413-a as a first-level clipped and filtered sequence of modulated data. In some embodiments, this signal 413-a would now be sent to an up-converter and a power amplifier (not shown in FIG. 8A). In some embodiments, this signal 413-a is sent back into the clipping and filtering system, as explained in FIG. 8B below.

Figure 8B:
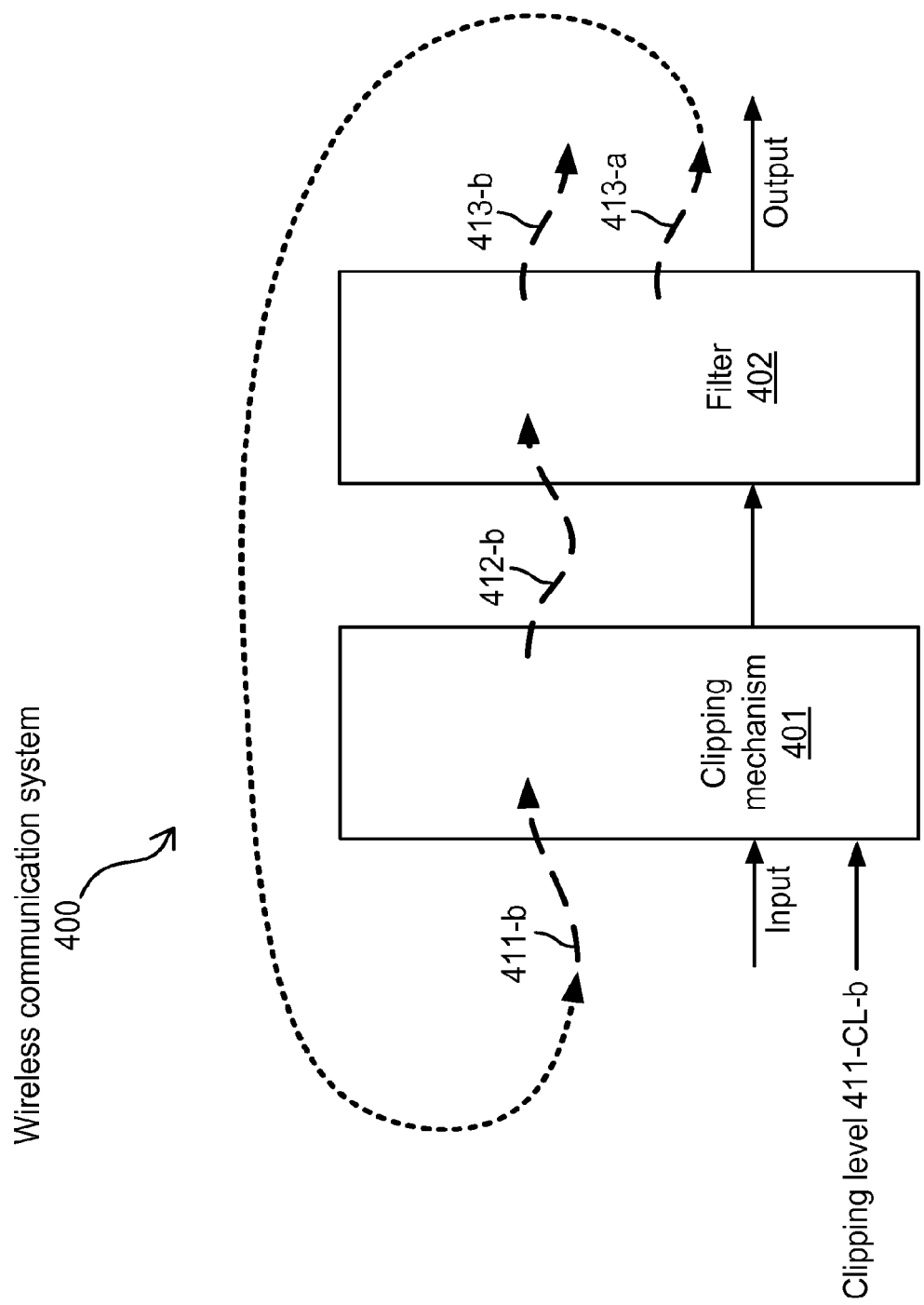
FIG. 8B illustrates one embodiment of a wireless communication system a clipping mechanism and a filter for a second iteration of clipping a signal.

FIG. 8B illustrates one embodiment of a wireless communication system 400 a clipping mechanism and a filter for a second iteration of clipping a signal. The clipped and filtered sequence of modulated data 413-a from FIG. 8A is now fed into the system as new signal 411-b. Sequence of modulated data 411-b is inputted as a signal into the clipping mechanism 401. The clipping mechanism 401 has now been set at second clipping level 411-CL-b, and clips the signal according to this second level. The clipped signal of modulated data is outputted as 412-b, and is then passed through the filter 402, which executes out-of-band signal filtering, and outputs the signal 413-b as a second-level clipped and filtered sequence of modulated data. In some embodiments, this signal 413-b would now be sent to an up-converter and a power amplifier (not shown in FIG. 8B). In some embodiments this signal 413-b is sent back into the clipping and filtering system, as explained in FIG. 8C below.

Figure 8C:
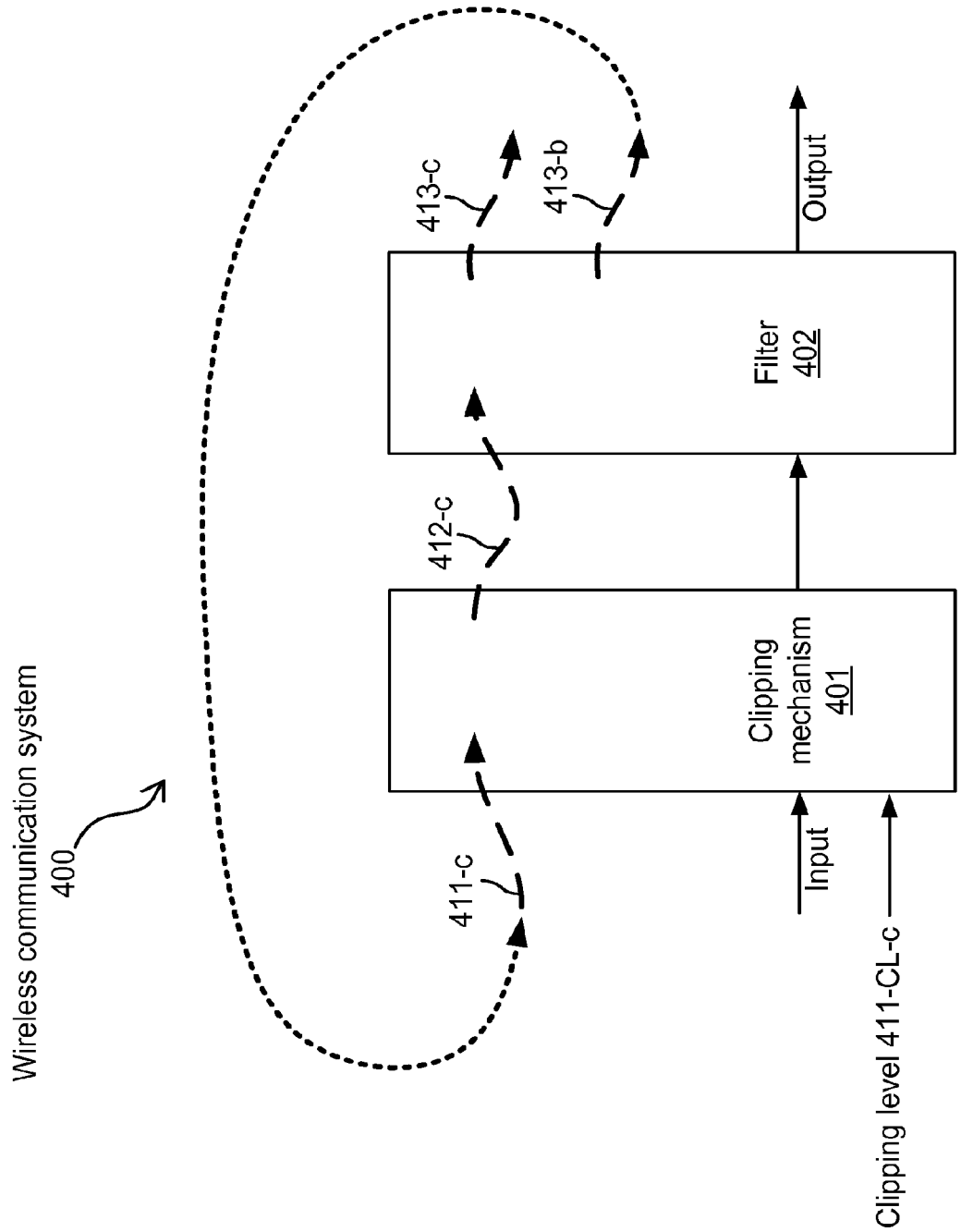
FIG. 8C illustrates one embodiment of a wireless communication system a clipping mechanism and a filter for a third iteration of clipping a signal.

FIG. 8C illustrates one embodiment of a wireless communication system a clipping mechanism and a filter for a third iteration of clipping a signal. The clipped and filtered sequence of modulated data 413-*b* from FIG. 8B is now fed into the system as new input 411-*c*. Sequence of modulated data 411-*c* is inputted as a signal into the clipping mechanism 401. The clipping mechanism 401 has now been set at third clipping level 411-CL-c, and clips the signal according to this third level. The clipped signal of modulated data is outputted as 412-*c*, and is then passed through the filter 402, which executed out-of-band signal filtering, and outputs the signal 413-*c* as a third-level clipped and filtered sequence of modulated data. In some embodiments, this signal 413-*c* would now be sent to an up-converter and a power amplifier (not shown in FIG. 8C). In some embodiments, this modulated signal will pass through fourth, fifth, or additional rounds of clipping and filtering.

Figure 9A:
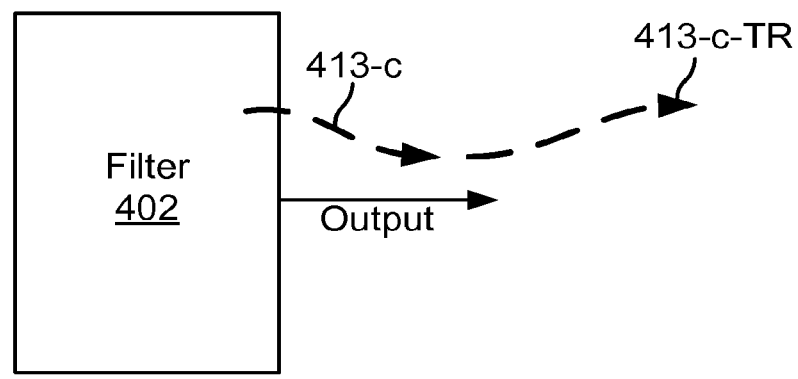
FIG. 9A illustrates one embodiment of a wireless communication sub-system with a filter for out-of-band signal filtering.

FIG. 9A illustrates one embodiment of a wireless communication sub-system with a filter 402 for out-of-band signal filtering. As shown in FIG. 9A, filter 402 has outputted third level clipped and filtered sequence of data 413-*c*. In this embodiment shown, three iterations have produced a signal 413-*c* which is sufficiently good so that it need not be sent for a fourth iteration, but rather is sent as 413-*c*-TR to an up-converter and a power amplifier (not shown in FIG. 9A), from where it will be transmitted.

Figure 9B:
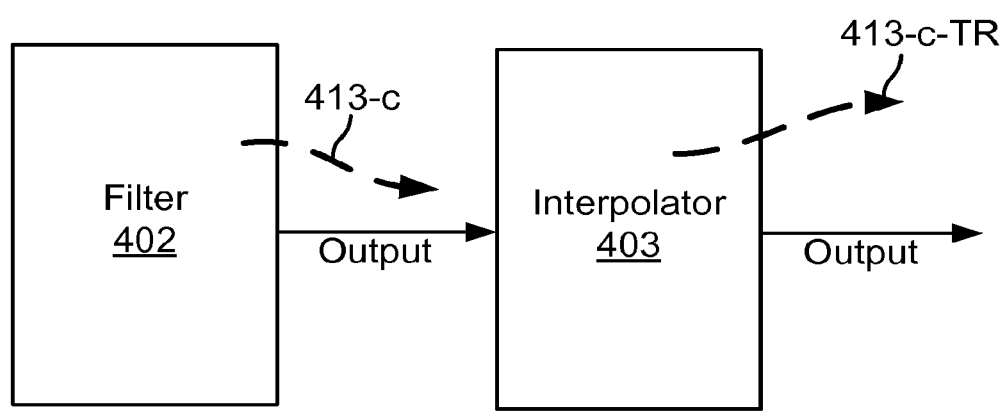
FIG. 9B illustrates one embodiment of a wireless communication sub-system with a filter and an interpolator for out-of-band signal filtering.

FIG. 9B illustrates one embodiment of a wireless communication sub-system with a filter 402 and an interpolator 403 for out-of-band signal filtering. The sequence of data 413-*c* is inputted into an interpolator 403, which further conditions the data with interpolation to produce signal 413-*c*-TR ready to be sent to an up-converter and a power amplifier (not shown in FIG. 9B), after which the amplified signal will be transmitted.

Figure 10A:
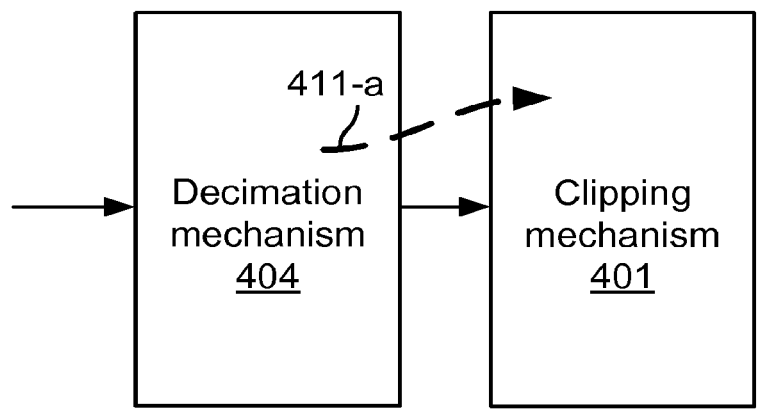
FIG. 10A illustrates one embodiment of a wireless communication sub-system with a decimation mechanism and a clipping mechanism.

FIG. 10A illustrates one embodiment of a wireless communication sub-system with a decimation mechanism 404 and a clipping mechanism 401. In FIG. 10A, before sequence of data 411-*a* is sent into a clipping mechanism 401 at a first level of clipping 411-CL-a, the sequence of data 411-*a* passes through a decimation mechanism 404, which conditions the data to create a decimated sequence of data. 411-*a*, in decimated form, is then sent to clipping mechanism 401 for a first level clipping.

Figure 10B:
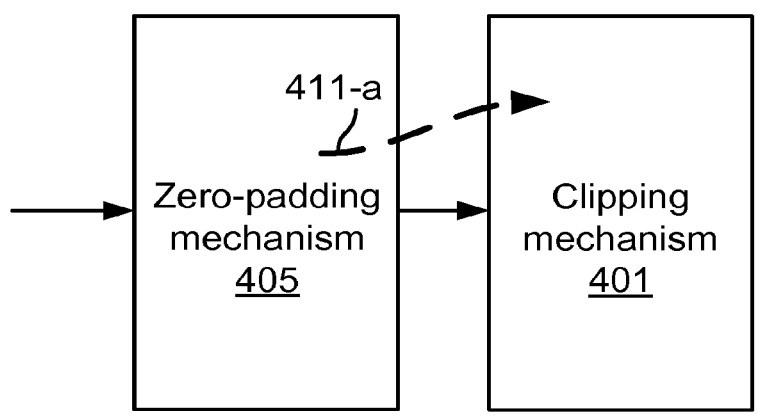
FIG. 10B illustrates one embodiment of a wireless communication sub-system with a zero-padding mechanism and a clipping mechanism.

FIG. 10B illustrates one embodiment of a wireless communication sub-system with a zero-padding mechanism 405 and a clipping mechanism 401. In FIG. 10B, before sequence of data 411-*a* is sent into a clipping mechanism 401 at a first level of clipping 411-CL-a, the sequence of data 411-*a* passes through a zero-padding mechanism 404, which conditions the data to create a zero-padded sequence of data. 411-*a*, in zero-padded form, is then sent to clipping mechanism 401 for a first level clipping.

Figure 11A:
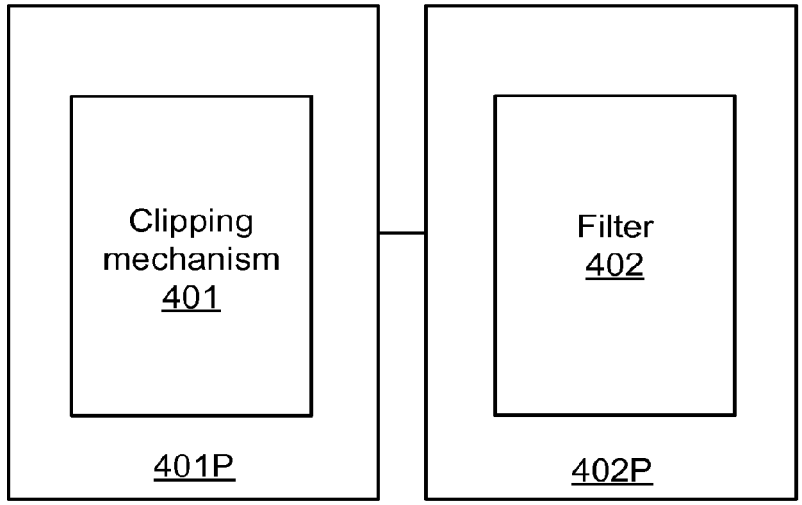
FIG. 11A illustrates one embodiment of a clipping mechanism and a filter at the microprocessor level.

FIG. 11A illustrates one embodiment of a clipping mechanism and a filter at the microprocessor level. In FIG. 11A, the clipping mechanism 401 is a processor, and the filter 402 is entirely different processor, as shown. In alternative embodiments, the clipping mechanism 401 and the filter 402 may be co-located on one processor.

Figure 11B:
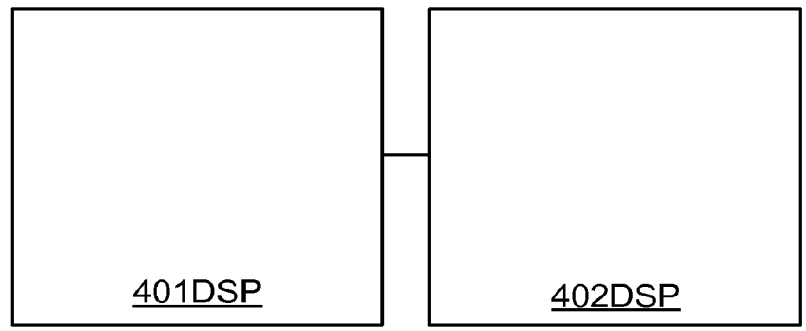
FIG. 11B illustrates one embodiment of a clipping mechanism and a filter at the DSP level.

FIG. 11B illustrates one embodiment of a clipping mechanism and a filter at the DSP level. In FIG. 11A, a first processor 401DSP is a digital signal processor ("DSP") and includes the clipping mechanism 401. In FIG. 11A, a second processor is a digital signal processor 402DSP, and includes the filter. In alternative embodiments, the clipping mechanism 401 and the filter 402 are co-located on one DSP.

Figure 12:
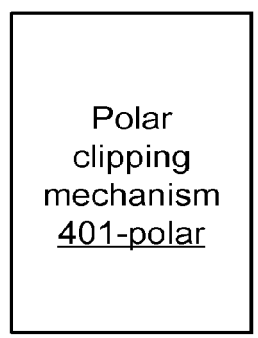
FIG. 12 illustrates one embodiment of a polar clipping mechanism.

FIG. 12 illustrates one embodiment of a polar clipping mechanism 401-polar. In FIG. 12, the clipping mechanism, which was 401 in prior figures, is now a polar clipping mechanism 401-polar, which executes polar clipping. In this embodiment, non-polar clipping, which was executed by clipping mechanism 401, does not occur, and is replaced by polar clipped executed by 401-polar.

Figure 13:
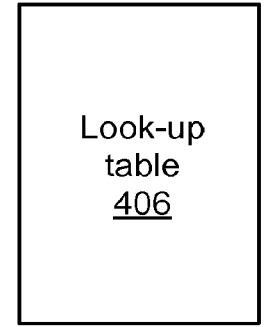
FIG. 13 illustrates one embodiment of a lookup table for determining a clipping level of a wireless transmission.

FIG. 13 illustrates one embodiment of a look-up table 406 for determining a clipping level of a wireless transmission. In FIG. 13, all iterations, where it is only the first level 411-CL-a, or the first two levels 411-CL-a and 411-CL-b, or the first three levels 411-CL-a and 411-CL-b and 411-CL-c, or four or more iterations, are based on the look-up table 406. In this particular embodiment, every clipping level is a function, at least in part, on its iteration number as first, second, third, fourth, or any subsequence number.

One embodiment is a wireless communication system 400 (FIG. 8A) operative to reduce iteratively a peak-to-average power ratio of wireless transmissions. In one particular form of such embodiment, there is a clipping mechanism 401 (FIG. 8A, 8B, 8C) operative to (i) receive sequences of modulated data 411-*a*, 411-*b*, 411-*c*, (ii) clip each sequence of modulated data using a settable clipping level, and (iii) output clipped sequences of modulated data 412-*a*, 412-*b*, 412-*c* associated with the sequences of modulated data, respectively. Also in this particular form of such embodiment, there is a filter 402 operative to (i) receive the clipped sequences of modulated data 412-*a*, 412-*b*, 412-*c*, (ii) filter out-of-band signals produced by the clipping mechanism 401 out of the clipped sequences of modulated data, and (iii) output clipped-and-filtered sequences of modulated data 413-*a*, 413-*b*, 413-*c* associated with the clipped sequences of modulated data, respectively. Also in this particular form of such embodiment, the wireless communication system 400 is operative to use the clipping mechanism 401 and the filter 402 iteratively, such that at least some of the clipped-and-filtered sequences of modulated data are fed back into the clipping mechanism 401, thereby constituting at least some of the sequences of modulated data as explained hereunder. As one example, first level clipped-and-filtered sequence 413-*a* is fed back and becomes second level clipped-and-filtered sequence 411-*b*, and second level clipped-and-filtered sequence 413-*b* is fed back and becomes third level clipped-and-filtered sequence 411-*c*. Also in this particular form of such embodiment, the wireless communication system 400 is set up, for each iteration of clipping and filtering, a clipping level that is unique and different than other clipping levels associated with other iterations. For example, (i) clipping level 411-CL-a is set-up for a first iteration associated with 411-*a*, 412-*a*, 413-*a*, (ii) clipping level 411-CL-b is set-up for a second iteration associated with 411-*b*, 412-*b*, 413-*b*, and (iii) clipping level 411-CL-c is set-up for a third iteration associated with 411-*c*, 412-*c*, 413-*c*.

In a first alternative embodiment to the wireless communication system 400 just described, the wireless communication system 400 is further operative to use a last of the clipped-and-filtered sequences of modulated data as a sequence for wireless transmission 413-*c*-TR (FIG. 9A) by the wireless communication system 400. In FIG. 8C, the last clipped-and-filtered sequence of modulated data is shown as 413-*c*, which is the sequence after three levels of clipping and filtering, but it is understood that there may be four or more levels of clipping and filtering, or only two levels of clipping and filtering, and the output of the last level will become the sequence for wireless transmission.

In a variation to the first alternative just described, the wireless communication system 400 further includes an interpolation mechanism 403 (FIG. 9B) operative to interpolate the last of said clipped-and-filtered sequences of modulated data 413-*c*, thereby producing the sequence for wireless transmission 413-*c*-TR (FIG. 9B) by said wireless communication system 400. Again, the last sequence is shown as 413-*c*, but it may be a later sequence after four or more levels of clipping and filtering, or a previous sequence after two levels of clipping and filtering.

In a second alternative embodiment to the wireless communication system 400 described above, the wireless communication system 400 is further operative to feed (FIG. 8A) a first of said sequences of modulated data 411-*a* as an initial input to the clipping mechanism 401, thereby triggering the iterative clipping and filtering operation.

In a first variation to the second alternative just described, the wireless communication system 400 further includes a decimation mechanism 404 (FIG. 10A) operative to produce the first of the sequences of modulated data 411-*a* as an initial input to the clipping mechanism 401.

In a second variation to the second alternative described above, the wireless communication system 400 further includes a zero-padding mechanism 405 (FIG. 10B) operative to produce the first sequence of modulated data 411-*a* as an initial input to the clipping mechanism 401.

In a third alternative embodiment to the wireless communication system 400 described above, further the clipping mechanism 401 is a first processor 401P (FIG. 11A) operative to perform the clipping.

In a variation to the third alternative embodiment just described, further the filter 402 is a second processor 402P (FIG. 11A) operative to filter out-of-band signals.

In a first configuration to the variation just described, further the first processor 401P and the second processor 402P are the same one processor 401P. In such configuration, the clipping mechanism and the filter are part of the same processor 401P.

In a second configuration to the variation to the third alternative embodiment described above, further the first processor 401P and the second processor 402P are digital signal processors, 401DSP and 402DSP, respectively (FIG. 11B).

In a fourth alternative embodiment to the wireless communication system 400 described above, further the clipping 401 mechanism is a polar clipping mechanism 401-polar (FIG. 12).

In a fifth alternative embodiment to the wireless communication system 400 described above, further each of the clipping levels, excluding the first clipping level 411-CL-a, is higher and thus more relaxed than previous clipping levels, thereby reducing distortions. For example, 411-CL-c is higher than 411-CL-b, and 411-CL-b is higher than 411-CL-a.

Figure 14:
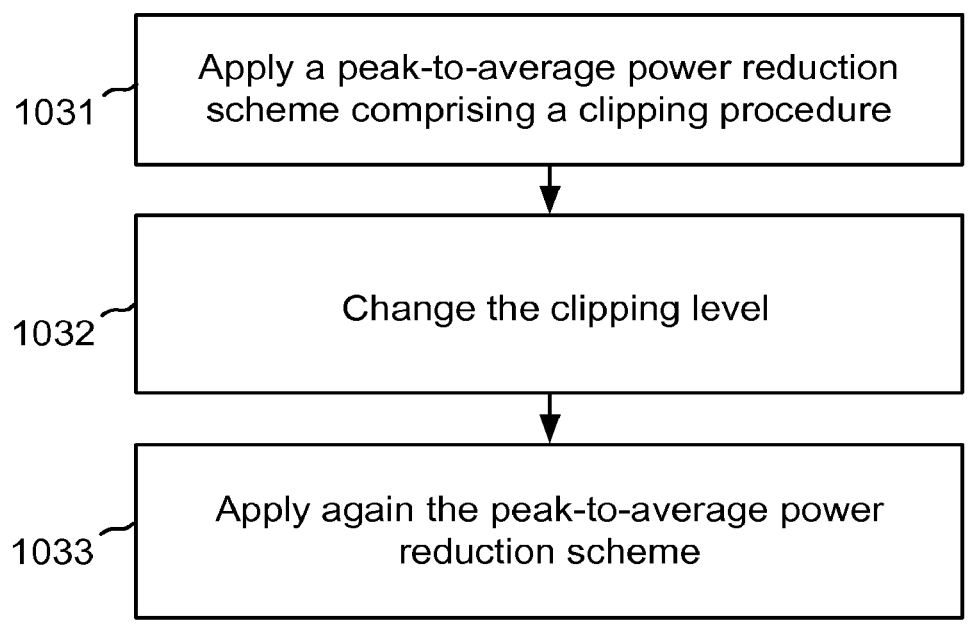
FIG. 14 illustrates one embodiment of a method by which a wireless communication system may reduce the peak-to-average power ratio of a wireless transmission by an iterative clipping scheme.

FIG. 14 illustrates one embodiment of a method by which a wireless communication system may reduce the peak-to-average power ratio of a wireless transmission by an iterative clipping scheme. In step 1031, a wireless communication system 400 applies, on a sequence of modulated data 411-*a*, a peak-to-average power ratio reduction scheme, where such scheme includes (i) a clipping procedure, executed by a clipping mechanism 401, followed by (ii) out-of-band signal filtering, executed by a filter 402, wherein the clipping procedure is set to a first clipping level 411-CL-a. Application of clipping and filtering at the first clipping level results in a first level clipped-and-filtered sequence of modulated data 413-*a*. In step 1032, the wireless communication system changes the setting of the clipping mechanism 401 from the first clipping level 411-CL-a to a second clipping level 411-CL-b. In step 1033, the wireless communication system again applies the peak-to-average power ratio reduction scheme, except now the scheme is applied to the first-level clipped and filtered sequence of modulated data 413-*a*, where sequence 413*a* is fed back to clipping mechanism 401 as 411-*b*. After a second level clipping and filtering, the result is an enhanced clipped-and-filtered sequence of modulated data 413-*b*, which is better optimized for transmission by said wireless communication system. Similarly, a third level clipping and filtering will result in sequence of modulated date 413-*c*, and subsequent levels of clipping and filtering will result in a higher sequence of modulated data, such as 413-*d* (not shown) after a fourth level of clipping and filtering, or 413-*e* (not shown) after a fifth level of clipping and filtering. The wireless communication system 400 is iterative, such that there may be two levels of clipping and filtering, or any number of levels greater than two.

In a first alternative embodiment to the method just described for reducing iteratively the PAPR, further the changing of the clipping and filtering level, and the applying again, is repeated iteratively until reaching a first criterion. Further, each iteration of changing the clipping and filtering level, and applying clipping and filtering again, is associated with a unique clipping level. For example, the first iteration is associated with level 411-CL-a, the second iteration is associated with level 411-CL-b, and the third iteration is associated with level 411-CL-c.

In a first variation to the first alternative method embodiment just described, further the first criterion is a predetermined and fixed number of iterations.

In a second variation to the first alternative method embodiment described above, further the first criterion is crossing below a first threshold of out-of-band signal power.

In a third variation to the first alternative method embodiment described above, further the first clipping level 411-CL-a, the second clipping level 411-CL-b, and each of the other unique clipping levels 411-CL-c and any subsequent level, are determined based on a look-up table 406 and as a function of iteration number.

In a fourth variation to the first alternative method embodiment described above, further the second clipping level 411-CL-b is higher than the first clipping level 411-CL-a by a fixed amount of decibels, and each of the unique clipping levels is higher than unique clipping level of previous iteration by this same fixed amount of decibels.

In a second alternative embodiment to the method described above for reducing iteratively the PAPR, further the second clipping level 411-CL-b is predetermined and fixed.

In a third alternative embodiment to the method described above for reducing iteratively the PAPR, further the second clipping level 411-CL-b is higher than said first clipping level 411-CL-a by a predetermined amount of decibels, thereby making the second clipping level more relaxed than said first clipping level, thereby reducing distortions.

In a variation to the third alternative method embodiment just described, further predetermined amount of decibels is between 0.3 decibel and 1 decibel.

In a configuration to the variation to the third alternative method embodiment just described, further said predetermined amount of decibels is approximately 0.5 decibels.

In a fourth alternative embodiment to the method described above for reducing iteratively the PAPR, further the clipping procedure comprises clipping the sequences of modulated data 411-*a*, 411-*b*, and 411-*c*.

In a variation to the fourth alternative method embodiment just described, further the clipping is a polar clipping.

In a fifth alternative embodiment to the method described above for reducing iteratively the PAPR, further decimating, by a decimation mechanism 404, an initial input sequence of modulated data (not shown), thereby producing the sequence of modulated data 411-*a* which is a decimated version of the initial input sequence of modulated data, and in this way matching a rate of the initial input sequence of modulated data to a desired rate of signal at clipping.

In a first variation to the fifth alternative method embodiment just described, further the decimating is operative to keep a sampling rate over signal bandwidth ratio within a predetermined range.

In a configuration to the variation to the fifth alternative method embodiment just described, further the predetermined range is between approximately 3 and approximately 5.

In a second variation to the fifth alternative method embodiment described above, further interpolating, by interpolator 403, FIG. 9B, the enhanced clipped and filtered sequence of modulated data 413-*c*, thereby producing 413-*c*-TR ready for transmission, and as result returning to the rate of initial input sequence (not shown) of modulated data. It is understood that if there are more than three levels of clipping and filtering, then the final sequence of modulated data will not be 413-*c*, but rather 413-*d* (not shown) or some higher level sequence of modulated data.

In a sixth alternative embodiment to the method described above for reducing iteratively the PAPR, further zero-padding, by a zero-padding mechanism 405, FIG. 10B, an initial input sequence (not shown) of modulated data, thereby producing the sequence of modulated data 411-*a* which is a zero-padded version of the initial input sequence of modulated data, and a result matching a rate of the initial input sequence of modulated data to a desired rate of clipping.

In variation to the sixth alternative method embodiment just described, further the zero-padding is operative to keep a sampling rate over signal bandwidth ratio within a predetermined range.

In a configuration to the variation to the sixth alternative method embodiment just described, further the predetermined range is between approximately 3 and approximately 5.

In a seventh alternative embodiment to the method described above for reducing iteratively the PAPR, further the wireless transmission system 400 transmitting, as signal 413-*c*-TR, FIG. 9A, FIG. 9B, the enhanced clipped and filtered sequence of modulated data 413-*c*. It is understood that if there are more than three levels of clipping and filtering, then the sequence of modulated data to be transmitted as signal 413-*c*-TR will not be 413-*c*, but rather 413-*d* (not shown) or another signal corresponding to the number of iterations of the clipping and filtering level.

In an eighth alternative embodiment to the method described above for reducing iteratively the PAPR, further the sequence of modulated data 411-*a* conforms to a wireless transmission standard selected from a group consisting of LTE, WiMAX, and WiFi.

In a variation to the eighth alternative method embodiment just described, further the modulation is selected from a group consisting of: BPSK, QPSK, 16-QAM, 64-QAM, and 256-QAM.

Figure 15A:
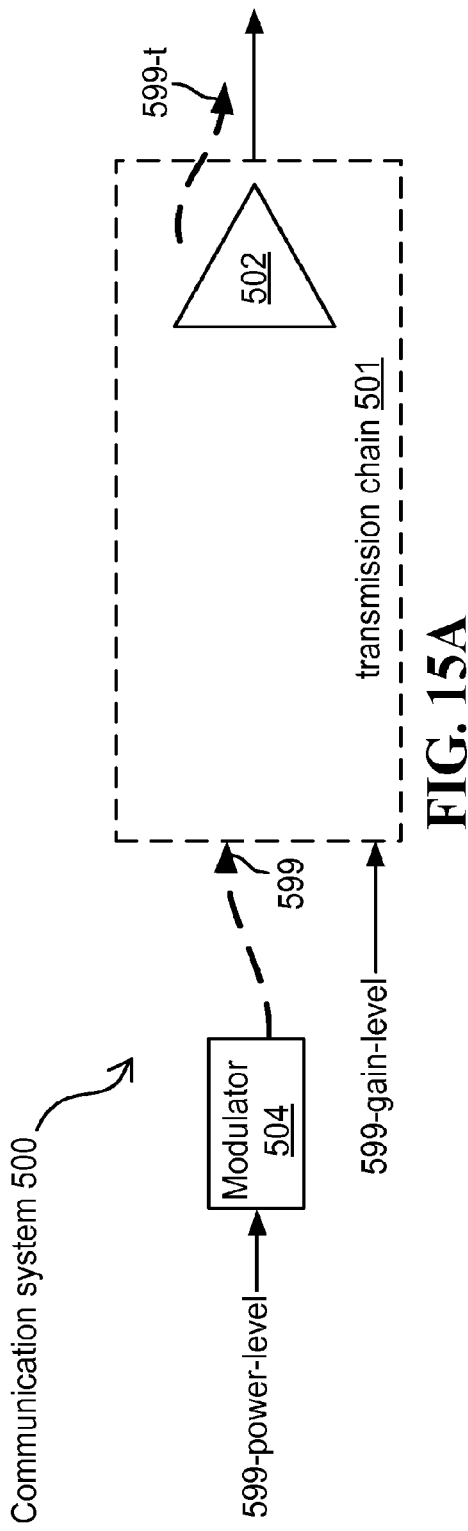
FIG. 15A illustrates one embodiment of a wireless communication system in a first state of operation, in which a certain configurable power level and a certain configurable transmission chain gain level are inputted to produce a signal with a particular output power.

FIG. 15A illustrates one embodiment of a wireless communication system 500 in a first state of operation, in which a certain configurable power level 599-power-level and a certain configurable transmission chain gain level 599-gain-level are set to produce an output signal 599-*t* with a particular output power. In FIG. 15A, there is a transmission signal 599 having a configurable or changing power level 599-power-level. A modulator 504 feeds the transmission signal 599 into a transmission chain 501. The transmission chain 501 applies a configurable gain level 599-gain-level to the transmission signal 599. The system includes also a power amplifier 502, which receives and amplifies the transmission signal 599, thereby producing the output signal 599-*t*.

Figure 15B:
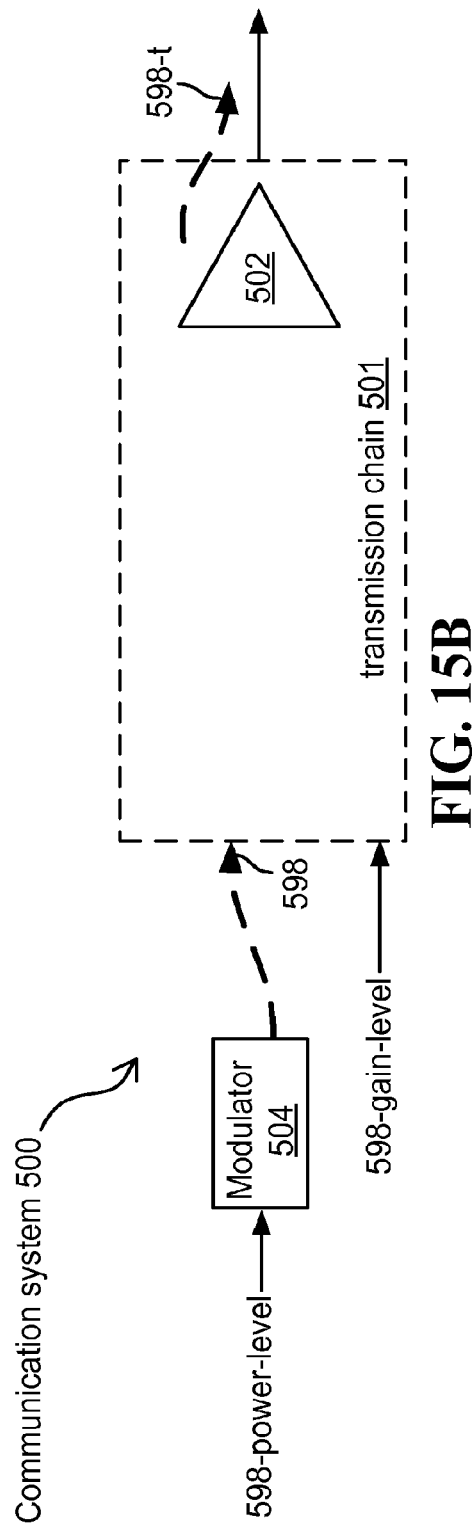
FIG. 15B illustrates one embodiment of a wireless communication system in a second state of operation, in which a certain configurable power level and a certain configurable transmission chain gain level are inputted to produce a signal with a particular output power, wherein either the input power level, or the input gain level, or both, is or are different from the inputs in the first state of operation.

FIG. 15B illustrates one embodiment of a wireless communication system 500 in a second state of operation, in which a certain configurable power level 598-power-level and a certain configurable transmission chain gain level 598-gain-level are set to produce an output signal 598-*t* with a particular output power, wherein either the input power level 598-power-level, or the input gain level 598-gain-level, or both, is or are different from the inputs in the first state of operation illustrated in FIG. 15A, such that an output signal 598-*t* is produced that has an output power that may be different from or similar to the output power of the output signal 599-*t* produced in the first state of operation FIG. 15A. The second state illustrated in FIG. 15B includes the modulator 504, the transmission chain 501, and the power amplifier 502, which appear also in the first state illustrated in FIG. 15A.

Figure 16:
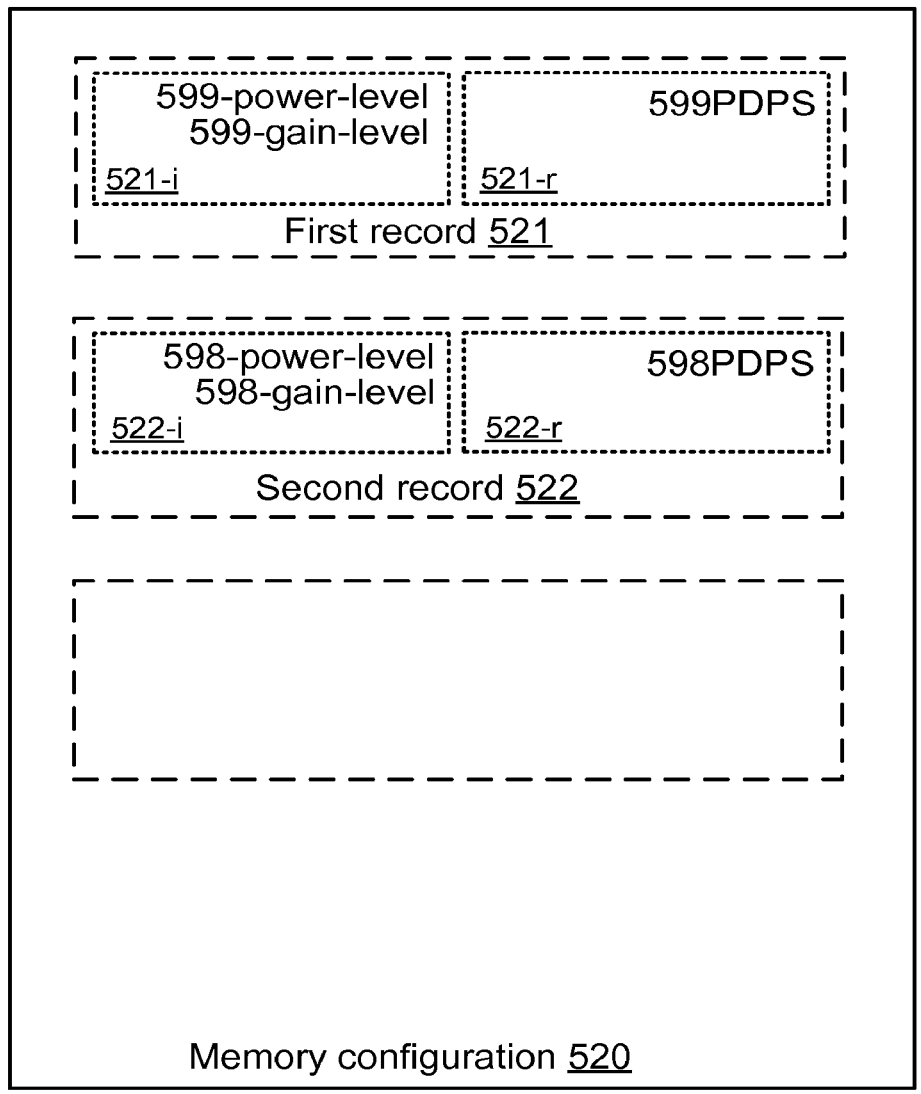
FIG. 16 illustrates one embodiment of a lookup table recording a plurality of system states in which each system state includes an input power level, an input gain level, and one or more pre-distortion parameters associated with such input levels of power and gain.

FIG. 16 illustrates one embodiment of a lookup table recording a plurality of system states in which each system state includes an input power level, an input gain level, and one or more pre-distortion parameters associated with such input levels of power and gain. FIG. 16 illustrates one embodiment of a memory configuration 520, which is an electronic memory holding the data comprising a lookup table. The lookup table consists of various records. Shown in FIG. 16 are first record 521 and second record 522, but it is understand that there may be three or more such records. Each record includes one set of at least two inputs, and one set of outputs. In the first record 521, there is a first state power level 599-power-level and a first state transmission chain gain level 599-gain-level, which together comprise a first set of input transmission parameters in the form of an index 521-*i*. The first record 521 includes also a first record entry 521-*r*, which includes a first set 599PDPS of pre-distortion parameters which were previously found to specifically counter distortions produced by a specific combination of the first state of power level 599-power-level and the first state of analog gain level of the transmission chain 599-gain-level. In the second record 522, there is a second state power level 598-power-level and a second state transmission chain gain level 598-gain-level, which together comprise a second set of input transmission parameters in the form of an index 522-*i*. The second record 522 includes also a second record entry 522-*r*, which includes a second set 598PDPS of pre-distortion parameters which were previously found to specifically counter distortions produced by a specific combination of the second state of power level 598-power-level and the second state of analog gain level of the transmission chain 598-gain-level. Additional records, which may be part of the lookup table but which are not illustrated in FIG. 16, would also include an index of input transmission parameters and a record or pre-distortion parameters found to specifically counter distortions produced by the specific combination of the power level and analog gain level for the particular state of the system represented by the record.

Figure 17A:
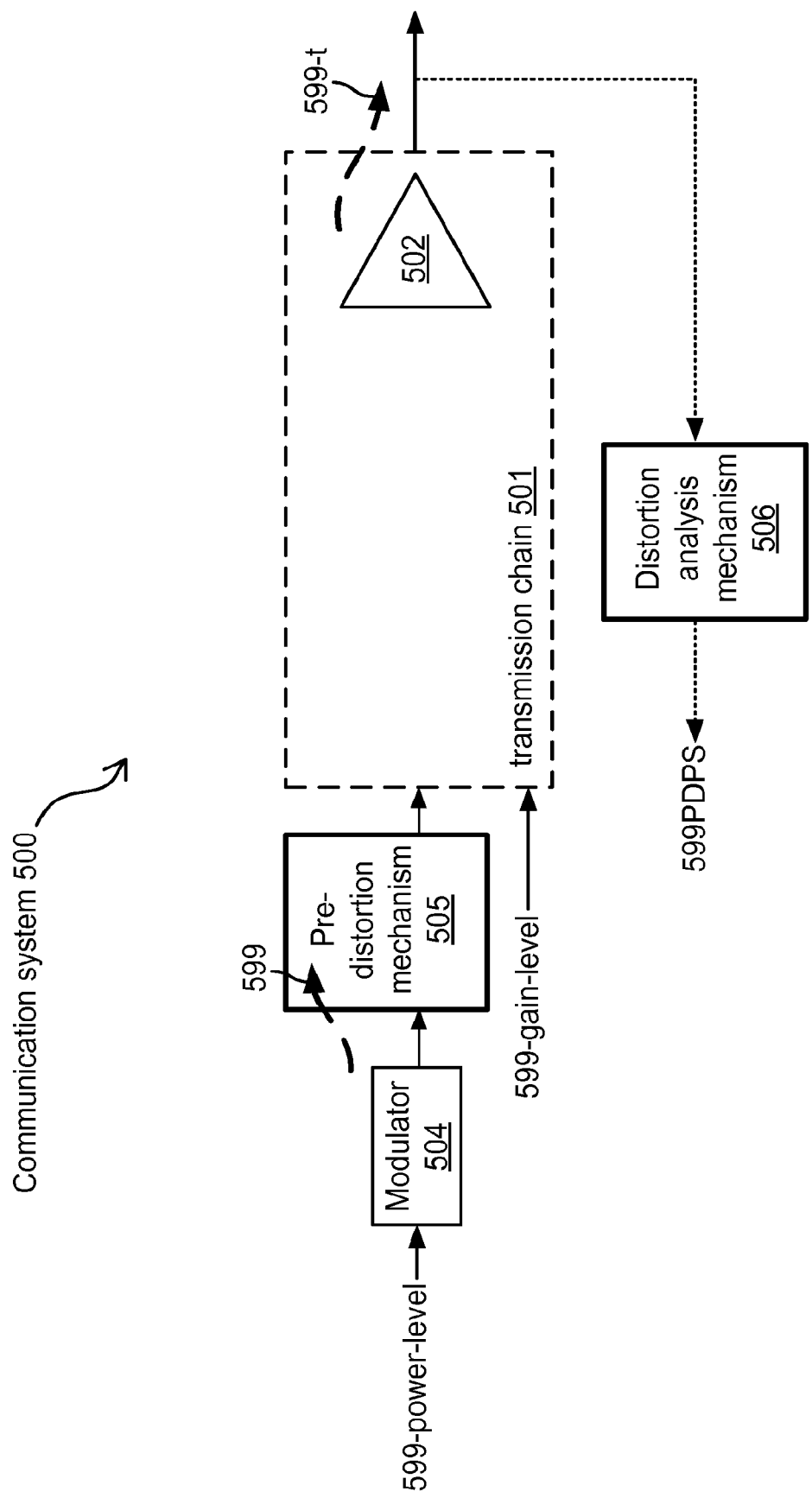
FIG. 17A illustrates one embodiment of a wireless communication system in a first state of operation, including a distortion analysis mechanism that derives one or more pre-distortion parameters from the analysis of distortions in an output signal, and including also a pre-distortion mechanism operative to execute a pre-distortion procedure on an input transmission signal.

FIG. 17A illustrates one embodiment of a wireless communication system 500 in a first state of operation, including a distortion analysis mechanism 506 that derives one or more sets of pre-distortion parameters 599PDPS from the analysis of distortions in an output signal 599-*t*, and including also a pre-distortion mechanism 505 operative to execute a pre-distortion procedure on an input transmission signal 599. In FIG. 17A, an input transmission signal 599 at a given power level 599-power-level, passes through a modulator 504 and then a pre-distortion mechanism 505 operative to execute a pre-distortion procedure on the signal 599, after which the signal 599 is sent to a transmission chain 501 with a configurable gain level 599-gain-level, and then to a power amplifier 502 which amplifies the signal 599 and produces an output signal 599-*t*. The power amplifier 502 may be part of the transmission chain 501. Output signal 599-*t* is analyzed by a distortion analysis mechanism 506 operative to derive a set of pre-distortion parameters 599PDPS. The input power level 599-power level, the transmission gain level 599-gain-level, and the set of pre-distortion parameters 599PDPS, for this state of the communication system 500, are added to the memory configuration 520 in FIG. 16 to create a new record.

Figure 17B:
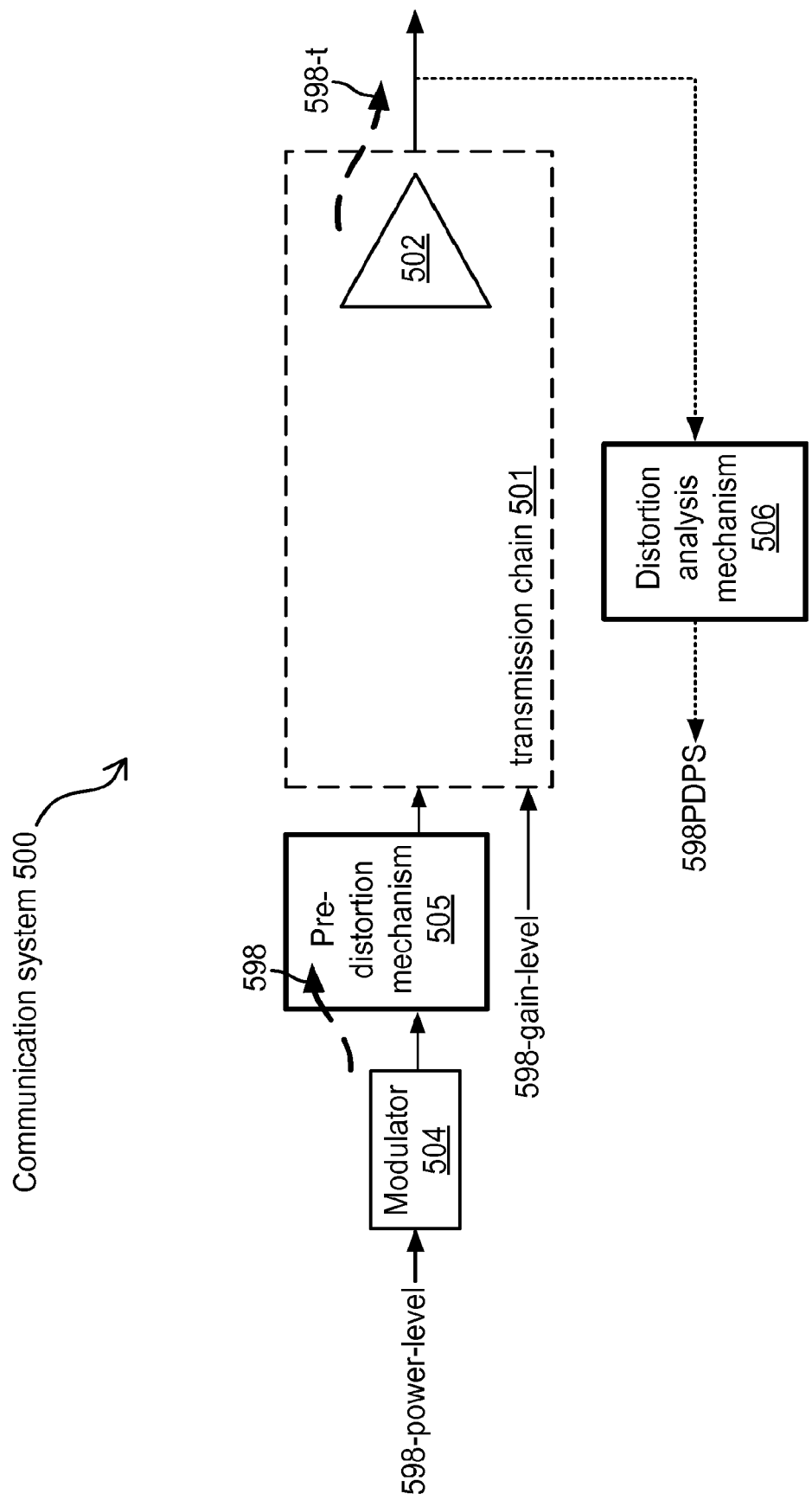
FIG. 17B illustrates one embodiment of a wireless communication system in a second state of operation, including a distortion analysis mechanism that derives one or more pre-distortion parameters from the analysis of distortions in an output signal, and including also a pre-distortion mechanism operative to execute a pre-distortion procedure on an input transmission signal.

FIG. 17B illustrates one embodiment of a wireless communication system 500 in a second state of operation, including a distortion analysis mechanism 506 that derives one or more sets of pre-distortion parameters 598PDPS from the analysis of distortions in an output signal 598-*t*, and including also a pre-distortion mechanism 505 operative to execute a pre-distortion procedure on an input transmission signal 598. In FIG. 17A, an input transmission signal 598 at a given power level 598-power-level, passes through a modulator 504 and then a pre-distortion mechanism 505 operative to execute a pre-distortion procedure on the signal 598, after which the signal 598 is sent to a transmission chain 501 with a configurable gain level 598-gain-level, and then to a power amplifier 502 which amplifies the signal 598 and produces an output signal 598-*t*. The power amplifier 502 may be part of the transmission chain 501. Output signal 598-*t* is analyzed by a distortion analysis mechanism 506 operative to derive a set of pre-distortion parameters 598PDPS. The input power level 598-power level, the transmission gain level 598-gain-level, and the set of pre-distortion parameters 598PDPS, for this state of the communication system 500, are added to the memory configuration 520 in FIG. 16 to create a new record.

Figure 18A:
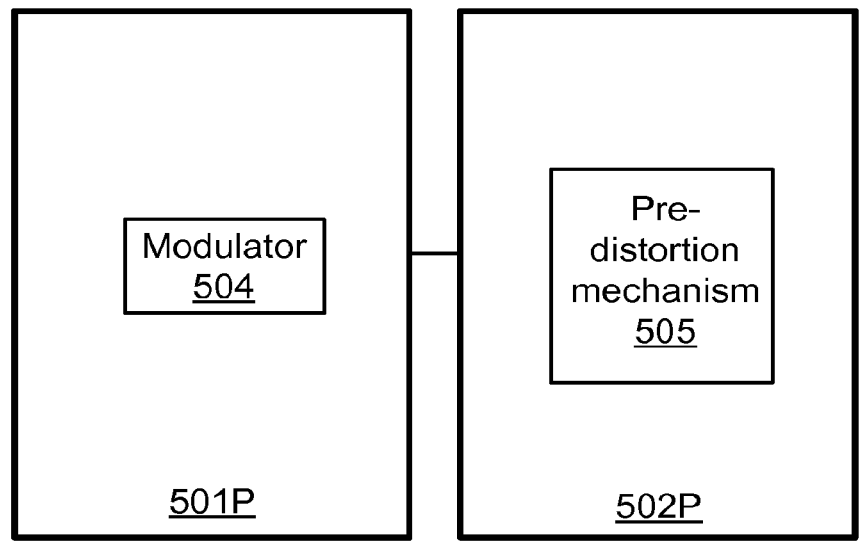
FIG. 18A illustrates one embodiment of two processors, in which a modulator is implemented in the first processor and a pre-distortion mechanism is implemented in the second processor.

FIG. 18A illustrates one embodiment of two processors 501P and 502P, in which a modulator 504 is implemented in the first processor 501P and a pre-distortion mechanism 505 is implemented in the second processor 502P. Although FIG. 18A illustrates and embodiment with two processors 501P and 502P, it is understood that the modulator 504 and the pre-distortion mechanism 505 may be implemented in a single processor. Although FIG. 18A shows a direct connection between first processor 501P and second processor 502P, it is understood that intervening components, or products, or communication pathways, may stand between first processor 501P and second processor 502P, although the two processors 501P and 502P are part of the same general communication system 500 illustrated in other figures.

Figure 18B:
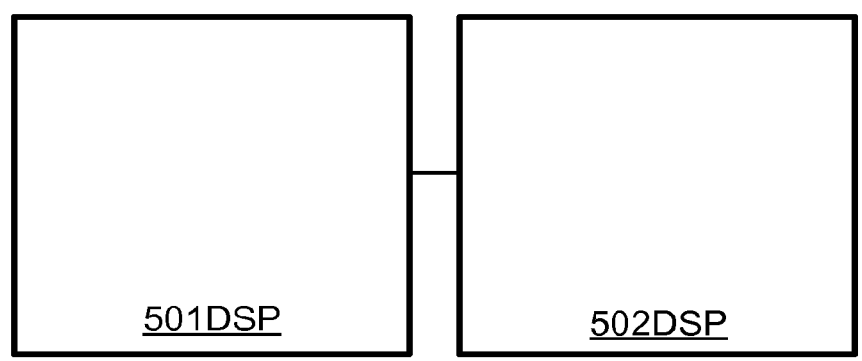
FIG. 18B illustrates one embodiment of two digital-signal-processors, in which a modulator is implemented in the first digital-signal-processor and a pre-distortion mechanism is implemented in a second digital-signal-processor.

FIG. 18B illustrates one embodiment of two digital-signal-processors 501DSP and 502DSP, in which a modulator 504, not shown in FIG. 18B, is implemented in the first digital-signal-processor 501DSP, and a pre-distortion mechanism 505, not shown in FIG. 18B, is implemented in a second digital-signal-processor 501DSP. Although FIG. 18A illustrates and embodiment with two digital-signal-processors 501DSP and 502DSP, it is understood that the modulator 504 and the pre-distortion mechanism 505 may be implemented in a single digital-signal-processor. Although FIG. 18BA shows a direct connection between first digital-signal-processor 501DSP and second digital-signal-processor 502DSP, it is understood that intervening components, or products, or communication pathways, may stand between first digital-signal-processor 501DSP and second digital-signal-processor 502DSP, although the two digital-signal-processors 501DSP and 502DSP are part of the same general communication system 500 illustrated in other figures.

Figure 19:
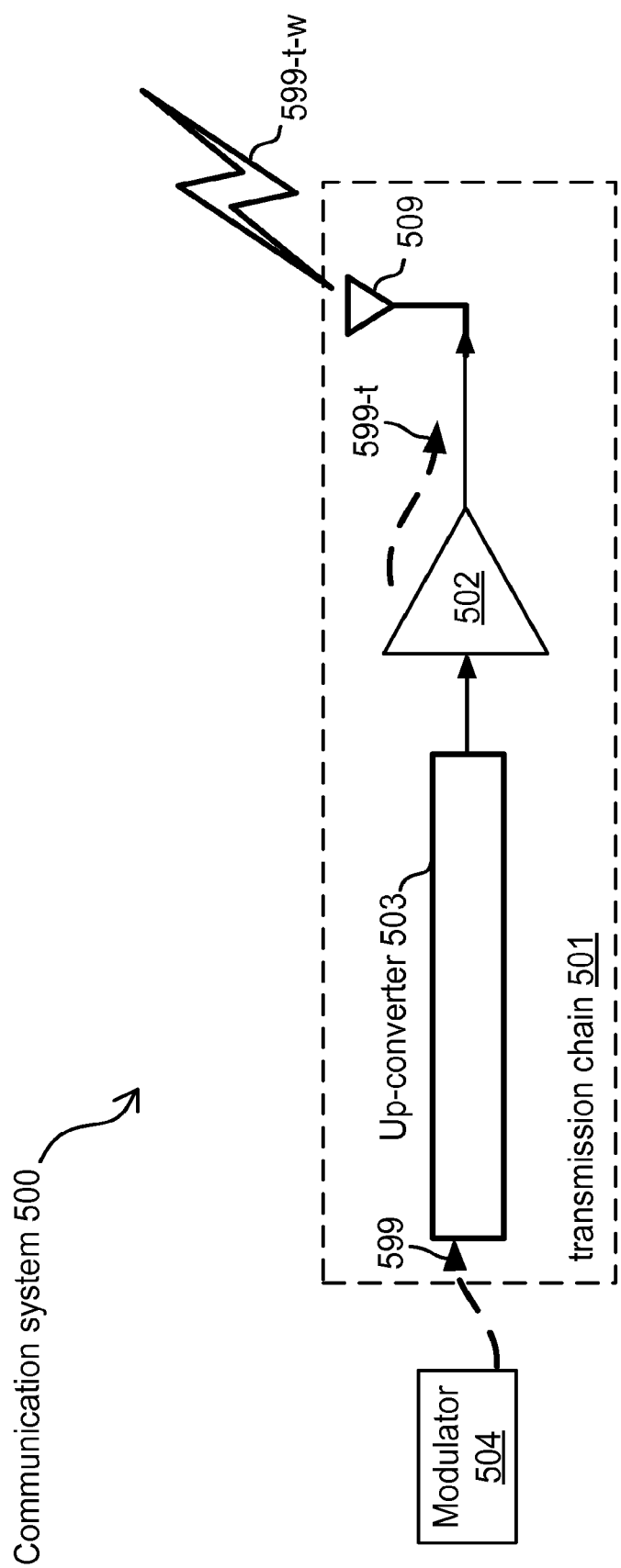
FIG. 19 illustrates one embodiment of a communication system transmitting a base-band transmission signal, including an up-converter operative to up-convert the base-band transmission signal into a transmission frequency associated with a power amplifier, and including also an antenna operative to transmit wirelessly an output signal produced by the power amplifier in conjunction with the base-band transmission signal.

FIG. 19 illustrates one embodiment of a communication system 500 transmitting a base-band transmission signal 599. The system includes a modulator 504 that modulates the base-band transmission signal, and a transmission chain 501 that transmits a wireless output signal 599-*t*-*w*. The transmission chain 501 includes an up-converter 503 operative to up-convert the base-band transmission signal 599 into a transmission frequency associated with a power amplifier 502, the power amplifier 502 then amplifies the signal to create an output signal 599-*t*, and antenna 509 operative to wireless transmit 599-*t*-*w* the output signal 599-*t* from the amplifier 502.

One embodiment is a communication system 500 operative to manage pre-distortion procedures. In one specific embodiment, the system 500 includes a transmission chain 501 that includes a power amplifier 502, and in which the transmission chain 501 is associated with a level of analog gain 599-gain-level or 598-gain-level that is configurable by the communication system 500. Also in this specific embodiment, the system 500 includes a modulator 504 operative to feed the transmission chain 501 with a transmission signal 599 or 598, where the power level 599-power-level or 598-power-level is configurable by the communication system. It is noted that configuring power level 599-power-level or 598-power-level by system 500 may be done directly by digitally scaling signal 599 or 598, or it can be done indirectly by a changing demand for data resources by client devices served by system 500. In one non-limiting example, a first state transmission signal 599 is configured to have a first level of power 599-power-level, and a second state transmission signal 598 is configured to have a second level of power 598-power-level. Also in this specific embodiment, the communication system 500 is operative to find, record, and use sets of pre-distortion parameters 599PDPS or 598PDPS in conjunction with a pre-distortion procedure, wherein each set of pre-distortion parameters 599PDPS or 598PDPS is operative to specifically counter distortions produced in the power amplifier 502 by a specific combination of the level of power 599-power-level or 598-power-level, and the level of analog gain of the transmission chain 501, 599-gain-level or 598-gain-level, respectively. In one non-limiting example, set of pre-distortion parameters 599PDPS is operative to specifically counter distortions produced by the combination 599-power-level and 599-gain-level, and set of pre-distortion parameters 598PDPS is operative to specifically counter distortions produced by the combination 598-power-level and 598-gain-level.

In a first alternative to the system 500 described above, the system 500 further includes a memory configuration 520 operative to facilitate recording and extraction of the sets of pre-distortion parameters 599PDPS and 598PDPS, in which each set of pre-distortion parameters in association with a specific combination of the level of power and the level of analog gain.

In a variation of the first alternative just described, further the memory configuration 520 includes at least a first 521 and a second 522 record, in which the first record 521 includes at least (i) a first index entry 521-*i* and (ii) a first record entry 521-*r*. The first index entry 521-*i* describes a combination of a first power level 599-power-level and a first analog gain level 599-gain-level. In one non-limiting example a first power level 599-power-level is 5 dBm and a first analog gain level 599-gain-level is 40 dB. The first record entry 521-*r* describes a first set of pre-distortion parameters 599PDPS previously found to specifically counter distortions produced by a specific combination of the first level of power 599-power-level and the first level of analog gain 599-gain-level. Also in this variation embodiment, the second record 522 includes at least (i) a second index entry 522-*i* and (ii) a second record entry 522-*r*. The second index entry 522-*i* describes a combination of a second power level 598-power-level and a second analog gain level 598-gain-level. In one non-limiting example a second power level 598-power-level is 0 dBm and a second analog gain level 599-gain-level is 47 dB. The second record entry 522-*r* describes a second set of pre-distortion parameters 598PDPS previously found to specifically counter distortions produced by a specific combination of the second level of power 598-power-level and the second level of analog gain 598-gain-level.

In a second alternative to the system operative to manage pre-distortion procedures described above, the system further includes a distortion-analysis mechanism 506 operative to derive the sets of pre-distortion parameters 599PDPS and 598PDPS, by analyzing distortions in an output signal, 599-*t* and 598-*t*, respectively, produced by the power amplifier 502 in conjunction with the specific combinations of level of power 599-power-level and 598-power-level and the level of analog gain 599-gain-level and 598-gain-level, respectively.

In a variation of the second alternative system described above, further the distortion-analysis mechanism 506 is operative to derive a first of the sets of pre-distortion parameters 599PDPS that specifically counter distortions produced by a specific combination of a first of level of power 599-power-level and a first level of analog gain 599-gain-level.

In a particular configuration of the variation of the second alternative system, described above, further the distortion-analysis mechanism 506 is operative to derive a second set of pre-distortion parameters 598PDPS that specifically counter distortions produced by a specific combination of a second level of power 598-power-level and a second level of analog gain 598-gain-level.

In a third alternative to the system operative to manage pre-distortion procedures described above, the system further includes a pre-distortion mechanism 505 operative to execute the pre-distortion procedure on the input transmission signal 599 or 598.

In a variation of the third alternative system described above, the system further includes at least a first processor 501P and a second processor 502P, wherein the modulator 504 is a digital modulator implemented in the first processor 501P, the transmission signal is a digital base-band transmission signal generated in the digital modulator 504, and the pre-distortion mechanism 505 is a digital pre-distortion mechanism 505 implemented in the second processor 502P.

In a first possible configuration of the variation to the third alternative system described above, the first processor 501P and the second processor 502P are a same processor.

In a second possible configuration of the variation to the third alternative system described above, the first processor 501P and the second processor 502P are digital-signal-processors 501DSP and 502DSP, respectively.

In a fourth alternative to the system operative to manage pre-distortion procedures described above, further the transmission signal 599 is a base-band transmission signal, and the transmission chain 501 includes also an up-converter 503 operative to up-convert the base-band transmission signal 599 into a transmission frequency associated with the power amplifier 502.

In a variation of the fourth alternative system described above, the transmission chain 501 further includes an antenna 509 operative to transmit wirelessly 599-*t-w* an output signal 599-*t* produced by the power amplifier 502 in conjunction with the transmission signal 599.

Figure 20:
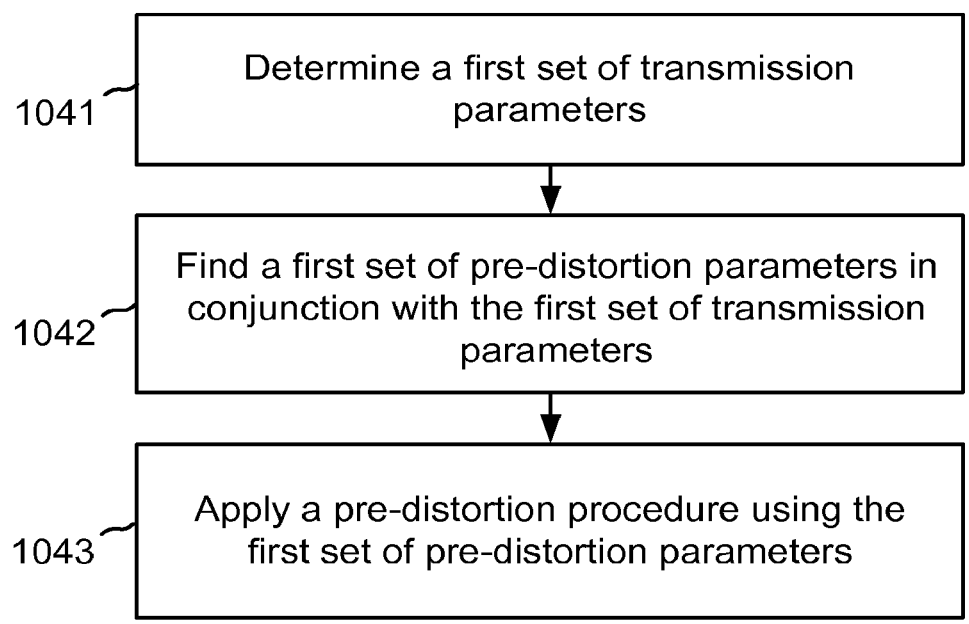
FIG. 20 illustrates one embodiment of a method by which a communication system may manage pre-distortion procedures.

FIG. 20 illustrates one embodiment of a method by which a wireless communication system 500 may manage pre-distortion procedures. In step 1041, a communication system 500 determines a first set of transmission parameters associated with a transmission chain 501 belonging to communication system 500, in which the first set of transmission parameters include at least (i) a first level of power 599-power-level associated with a first transmission signal 599 feeding the transmission chain 501, and (ii) a first level of analog gain 599-gain-level as applied by the transmission chain 501 to the first transmission signal 599. In step 1042, the communication system 500 finds a first set of pre-distortion parameters 599PDPS associated with a pre-distortion procedure operative to counter distortions produced in conjunction with said first set of transmission parameters in a power amplifier 502 belonging to the transmission chain 501. In step 1043, the communication system 500 applies the pre-distortion procedure using the first set of pre-distortion parameters 599PDPS, thereby at least partially countering the distortions.

In a first alternative to the method described above for managing pre-distortion procedures, further the communication system 500 derives the first set of pre-distortion parameters 599PDPS by analyzing distortions in an output signal 599-*t* produced by the power amplifier 502 in conjunction with said first set of transmission parameters.

In a variation of the first alternative method described above, the system 500 further records 521 the first set of pre-distortion parameters 599PDPS in association with the first set of transmission parameters, for later use by the communication system 500.

In a second alternative to the method described above for managing pre-distortion procedures, further the communication system 500, using the first set of transmission parameters as index 521-*i*, searches for the first set of pre-distortion parameters 599PDPS in a record 521 associating transmission parameters with pre-distortion parameters.

In a third alternative to the method described above for managing pre-distortion procedures, further the system repeats the steps of determining 1041, finding 1042, and applying procedures 1043.

In a first variation of the third alternative method described above, the repeating includes determining, by the communication system 500, a second set of transmission parameters associated with the transmission chain 501, and this second set of transmission parameters includes at least (i) a second level of power 598-power-level associated with a second transmission signal 598 feeding the transmission chain 501, and (ii) a second level of analog gain 598-gain-level as applied by the transmission chain 501 to said second transmission signal 598. Also in this variation, the repeating includes finding, by the communication system 500, a second set of pre-distortion parameters 598PDPS associated with a pre-distortion procedure operative to counter distortions produced in conjunction with the second set of transmission parameters in the power amplifier 502. Also in this variation, the repeating includes applying, by the communication system 500, the pre-distortion procedure, using the second set of pre-distortion parameters 598PDPS, thereby at least partially countering the distortions produced in conjunction with the second set of transmission parameters.

In a second variation of the third alternative method described above, further the communication system 500 concludes that the first set of transmission parameters, previously associated with said transmission chain 501, is no longer accurately describing a state of the transmission chain 501, and lack of such accurate description triggers the repeating.

In a third variation of the third alternative method described above, the repeating of steps determining 1041, finding 1042, and applying procedures 1043, is done periodically.

In a fourth variation of the third alternative method described above, the communication system 500 further concludes that a signal 599-$t$ produced by said power amplifier 502 is distorted beyond a predetermined threshold, thereby implying that the first set of pre-distortion parameters 599PDPS no longer correctly serve the pre-distortion procedure, and this lack of correctly serving triggers the repeating.

In a fourth alternative to the method described above for managing pre-distortion procedures, the first set of transmission parameters further comprises at least one additional parameter selected from a group consisting of: (i) a temperature associated with the power amplifier 502, and (ii) a frequency associated with transmission chain 501.

In a fifth alternative to the method described above for managing pre-distortion procedures, further the first transmission signal 599 is a base-band transmission signal.

In a variation of the fifth alternative method described above, further the first level of power 599-power-level associated with the base-band transmission signal 599 depends, at least in part, on a level of data resource usage associated with the base-band transmission signal 599, wherein a higher data resource usage results in a higher level of power. In one embodiment, said level of data resource usage is determined by at least one client device served by communication system 500.

In a sixth alternative to the method described above for managing pre-distortion procedures, further the first transmission signal 599 is associated with a communication standard selected from a group consisting of: (i) LTE, (ii) GSM, (iii) UMTS, (iv) CDMA, (v) WiMAX, and (vi) WiFi.

In a seventh alternative to the method described above for managing pre-distortion procedures, further the determining of said the first set of transmission parameters includes the communication system 500 setting the first level of power 599-power-level and the first level of analog gain 599-gain-level.

In an eighth alternative to the method described above for managing pre-distortion procedures, further the determining of the first set of transmission parameters includes the communication system 500 measuring the first level of power 599-power-level and the first level of analog gain 599-gain-level.

In this description, numerous specific details are set forth. However, the embodiments/cases of the invention may be practiced without some of these specific details. In other instances, well-known hardware, materials, structures and techniques have not been shown in detail in order not to obscure the understanding of this description. In this description, references to "one embodiment" and "one case" mean that the feature being referred to may be included in at least one embodiment/case of the invention. Moreover, separate references to "one embodiment", "some embodiments", "one case", or "some cases" in this description do not necessarily refer to the same embodiment/case. Illustrated embodiments/cases are not mutually exclusive, unless so stated and except as will be readily apparent to those of ordinary skill in the art. Thus, the invention may include any variety of combinations and/or integrations of the features of the embodiments/cases described herein. Also herein, flow diagrams illustrate non-limiting embodiment/case examples of the methods, and block diagrams illustrate non-limiting embodiment/case examples of the devices. Some operations in the flow diagrams may be described with reference to the embodiments/cases illustrated by the block diagrams. However, the methods of the flow diagrams could be performed by embodiments/cases of the invention other than those discussed with reference to the block diagrams, and embodiments/cases discussed with reference to the block diagrams could perform operations different from those discussed with reference to the flow diagrams. Moreover, although the flow diagrams may depict serial operations, certain embodiments/cases could perform certain operations in parallel and/or in different orders from those depicted. Moreover, the use of repeated reference numerals and/or letters in the text and/or drawings is for the purpose of simplicity and clarity and does not in itself dictate a relationship between the various embodiments/cases and/or configurations discussed. Furthermore, methods and mechanisms of the embodiments/cases will sometimes be described in singular form for clarity. However, some embodiments/cases may include multiple iterations of a method or multiple instantiations of a mechanism unless noted otherwise. For example, when a controller or an interface are disclosed in an embodiment/case, the scope of the embodiment/case is intended to also cover the use of multiple controllers or interfaces.

Certain features of the embodiments/cases, which may have been, for clarity, described in the context of separate embodiments/cases, may also be provided in various combinations in a single embodiment/case. Conversely, various features of the embodiments/cases, which may have been, for brevity, described in the context of a single embodiment/case, may also be provided separately or in any suitable sub-combination. The embodiments/cases are not limited in their applications to the details of the order or sequence of steps of operation of methods, or to details of implementation of devices, set in the description, drawings, or examples. In addition, individual blocks illustrated in the figures may be functional in nature and do not necessarily correspond to discrete hardware elements. While the methods disclosed herein have been described and shown with reference to particular steps performed in a particular order, it is understood that these steps may be combined, subdivided, or reordered to form an equivalent method without departing from the teachings of the embodiments/cases. Accordingly, unless specifically indicated herein, the order and grouping of the steps is not a limitation of the embodiments/cases. Embodiments/cases described in conjunction with specific examples are presented by way of example, and not limitation. Moreover, it is evident that many alternatives, modifications and variations will be apparent to those skilled in the art. Accordingly, it is intended to embrace all such alternatives, modifications and variations that fall within the spirit and scope of the appended claims and their equivalents.

What is claimed is:

1. A method for managing a pre-distortion procedure in a communication system comprising a transmission chain, the method comprising:

receiving an output signal from a transmission chain, the output signal having been operated on by the transmission chain;

a distortion analysis mechanism analyzing the output signal to determine a first set of transmission parameters associated with the transmission chain;

the distortion analysis mechanism determining a first set of pre-distortion parameters associated with the pre-distortion procedure based on the first set of transmission parameters; and a pre-distortion mechanism applying the pre-distortion procedure to a transmission signal using the first set of pre-distortion parameters;

determining a second set of transmission parameters associated with the transmission chain; and the transmission chain receiving the transmission signal from the pre-distortion mechanism.

2. The method of claim 1, wherein the first set of transmission parameters comprises
(i) a level of power associated with the transmission signal feeding the transmission chain, and
(ii) a level of analog gain applied by the transmission chain to the transmission signal.

3. The method of claim 2, wherein the determining of the first set of transmission parameters further comprises setting the level of power and the level of analog gain.

4. The method of claim 1, further comprising repeating
(i) determining the first set of transmission parameters,
(ii) determining the first set of pre-distortion parameters, and
(iii) applying the pre-distortion procedure.

5. The method of claim 4, wherein the repeating is performed periodically.

6. The method of claim 2, further comprising repeating
(i) determining the first set of transmission parameters,
(ii) determining the first set of pre-distortion parameters, and
(iii) applying the pre-distortion procedure.

7. The method of claim 6, wherein the repeating is performed periodically.

8. The method of claim 2, wherein the determining of the first set of transmission parameters further comprises measuring the level of power and the level of analog gain.

9. The method of claim 4, further comprising concluding, based on said repeating, that a previously determined first set of transmission parameters does not accurately describe a current state of the transmission chain.

10. The method of claim 1, wherein the first set of transmission parameters comprises at least one parameter selected from a group consisting of:
(i) a temperature associated with the transmission chain, and
(ii) a frequency associated with the transmission chain.

11. The method of claim 1, further comprising
finding that the second set of transmission parameters more accurately represents a current state of the transmission chain than the first set of transmission parameters;

based on the finding, determining a second set of pre-distortion parameters associated with the pre-distortion procedure; and applying the pre-distortion procedure within the transmission chain using the second set of pre-distortion parameters.

12. A communication system to manage pre-distortion procedures, comprising:

a pre-distortion mechanism, the pre-distortion mechanism receiving a transmission signal;

a transmission chain coupled to the pre-distortion mechanism, said transmission chain receiving a modified signal from the pre-distortion mechanism and generating an output signal, the transmission chain associated with one or more sets of transmission parameters configurable by said communication system;

a distortion analysis mechanism coupled to the output of the transmission chain, the distortion analysis mechanism receiving the output signal and using a pre-distortion procedure to counter distortions produced within said transmission chain, said distortions associated with said one or more sets of transmission parameters;

further wherein said communication system finds, records, and uses sets of pre-distortion parameters within said pre-distortion procedure, said distortion analysis mechanism deriving said sets of pre-distortion parameters by analyzing said distortions; and a memory configuration to facilitate recording and extraction of said derived sets of pre-distortion parameters;

each derived set of pre-distortion parameters used to counter distortions associated with a corresponding set of transmission parameters; and each derived set of pre-distortion parameters stored together with said corresponding set of transmission parameters in a corresponding record within said memory configuration.

13. The communication system of claim 12, wherein said one or more sets of transmission parameters comprises
(i) one or more levels of analog gain associated with said transmission chain, and
(ii) one or more levels of power associated with said transmission signal.

14. The communication system of claim 12 which further comprises a pre-distortion mechanism to execute said pre-distortion procedure.

15. The communication system of claim 12, wherein said one or more sets of transmission parameters comprises one or more parameters selected from a group consisting of:
(i) one or more temperatures associated with the transmission chain, and
(ii) one or more frequencies associated with the transmission chain.

* * * * *